United States Patent
Scripsick et al.

(10) Patent No.: US 9,798,071 B1
(45) Date of Patent: Oct. 24, 2017

(54) PYROELECTRIC ENERGY PRODUCTION

(75) Inventors: Michael P. Scripsick, Lafayette, NJ (US); Allen Geiger, Las Cruces, NM (US)

(73) Assignees: Michael P. Scripsick, Lafayette, NJ (US); Allen Geiger, Las Cruces, NM (US)

( * ) Notice: Subject to any disclaimer, the term of this patent is extended or adjusted under 35 U.S.C. 154(b) by 1528 days.

(21) Appl. No.: 13/470,114

(22) Filed: May 11, 2012

Related U.S. Application Data

(60) Provisional application No. 61/485,056, filed on May 11, 2011.

(51) Int. Cl.

| | |
|---|---|
| H02N 2/18 | (2006.01) |
| H01L 37/02 | (2006.01) |
| F21V 8/00 | (2006.01) |
| G02B 6/12 | (2006.01) |
| F03G 7/06 | (2006.01) |

(52) U.S. Cl.
CPC ....... *G02B 6/0061* (2013.01); *G02B 6/12019* (2013.01); *H01L 37/02* (2013.01); *H02N 2/18* (2013.01)

(58) Field of Classification Search
CPC .... G02B 6/0061; G02B 6/12019; H02N 2/18; H02N 10/00; H01L 37/02; H01L 37/04; F03G 7/06

See application file for complete search history.

(56) References Cited

U.S. PATENT DOCUMENTS

| | | |
|---|---|---|
| 6,528,898 B1 | 3/2003 | Ikura et al. |
| 2007/0017223 A1 | 1/2007 | Wootton et al. |
| 2010/0289377 A1 | 11/2010 | Erbil et al. |
| 2011/0091149 A1 | 4/2011 | Jen et al. |

OTHER PUBLICATIONS

G. Sebald, S. Pruvost, and D. Guyomar, Energy harvesting based on Ericsson pyroelectric cycles in a relaxor ferroelectric ceramic, Smart Materials and Structures 17, (6 pp.), 2008.
J. Xie, P. P. Mane, C. W. Green, K. M. Mossi, Kam K. Leang *Energy Harvesting by Pyroelectric Effect Using PZT*, Proceedings of SMASIS08, ASME Conference on Smart Materials, Adaptive Structures and Intelligent Systems Oct. 28-30, 2008, Ellicott City, Maryland, USA, 1, 2008.

(Continued)

*Primary Examiner* — David Porta
*Assistant Examiner* — Faye Boosalis
(74) *Attorney, Agent, or Firm* — Haynes and Boone, LLP

(57) ABSTRACT

An energy generator including a material having a Curie temperature is provided. The energy generator includes a hot source at a first temperature, a cold sink at a second temperature, a means to couple the hot source to the material while the cold sink is insulated from the material, and a means to couple the cold sink to the material while the hot source is insulated from the material, wherein: the first temperature higher than the Curie temperature, and the second temperature lower than the Curie temperature. Also provided is an energy generator including elements as above, between the hot source and the cold sink. Further provided is a genset having an engine for producing electrical energy, a coolant system, an exhaust element, and an alternator, and an energy generator as above. A method for use an energy generator as above is also provided.

23 Claims, 25 Drawing Sheets

(56) References Cited

OTHER PUBLICATIONS

Gael Sebald, Elie Lefeuvre, and Daniel Guyomar, *Pyroelectric Energy Conversion: Optimization Principles*, IEEE Transactions on ultrasonics, ferroelectrics, and frequency control, vol. 55, No. 3, Mar. 2008.

A.S. Mischenko, Q. Zhang, J. F. Scott, R. W. Whatmore, and N. D. Mathur,, A New Approach to Interconversion of Thermal and Electrical Energy, ICSICT '06. 8th International Conference on *Solid-State and Integrated Circuit Technology*, 2006.

Randall B. Olsen, and Diane Evans, *Pyroelectric energy conversion: Hysteresis lossand temperature sensitivity of a ferroelectric material*, J. Appl. Phys., 54 5942 (1983).

Lia Kouchachvili, Michio Ikura, *Pyroelectric conversion—Effects of P(VDF—TrFE) preconditioning onpower conversion*, Journal of Electrostatics 65 182 (2007).

A.A. Sklar, *A Numerical Investigation of a Thermodielectric Power Generation System*, Ph.D. Dissertation, Georgia institute of Technology, Dec. 2005.

S.B. Lang, *Pyroelectricity: From Ancient Curiosity to Modern Imaging Tool*, Physics Today, pp. 31-36, Aug. 2005.

Z. Malek, M. Polcarova, J. Strajblova, and J. Janta, *The Effect of Growth Rate on the Defect Structure and Dielectri Properties of TGS Single Crystals*, Phys. Stat. Solidi (a) 11, 195-206, 1972.

L. Kovacs, K. Polgar, C. Florea, *Electrical Conductivity of LiNbO$_3$*, in "Properties of Lithium Niobate", K. Wong (Ed.), pp. 91-96, Inspec, London 2002.

A.S. Bhalla and S.T. Liu, *Pyroelectric coefficients of ferroelectric pyroelectrics*, Table 4.2.4, in "Landolt-Bornstein—Group III Condensed Matter," 29b, (D.F. Nelson, Ed.), pp. 353-354, Springer-Verlag, 1993.

M. Ulex, R. Pankrath, K. Betzler, Growth of strontium barium niobate: the liquidus solidus phase diagram, J. Crystal Growth 271, 128-133, 2004.

T.M.Tritt and M.A. Subramanian, *Thermoelectric Materials, Phenomena, and Applications—A Bird's Eye View*, pp. 188-198, MRS Bulletin 31, Mar. 2006, www.mrs.org/bulletin.

H. Trabish, *Will the military be the bridge to the U.S. renewable energy future*, Sep. 29, 2011 http://www.greentechmedia.com/articles/read/will-the-military-be-the-bridge-to-the-u.s.-renewable-energy-future/ (2011), 5 pgs.

S. Hargreaves, Ambushes prompt military to cut energy use, Aug. 16, 2011, 2 pgs., http://money.cnn.com/2011/08/17/technology/military_energy/index.htm (2011).

S. Tong *Military and Energy: The Series* http://www.marketplace.org/topics/news-brief/military-and-energy-series, Aug. 29, 2011, 3 pgs.

*Frontline Commanders requesting Renewable Power Options*, Jan. 24, 2012, 11 pgs., http://www.defenseindustrydaily.com/commanders-in-iraq-urgently-request-renewable-power-options-02548/ (2011).

J. Wilde, *Growth and Characterization of Strontium Barium Niobate Crystals for Multiplaex Photorefractive Holography*, Ph.D Dissertaion, Department of applied Physics, Stanford University (1992).

*Application Engineering—Liquid Cooled Genset Application Manual*, Cummins Power Generation, Rev. Jan. 2011.

PCT Notification of Transmittal of the International Search Report for PCT Application No. PCT/US12/37639; filed May 11, 2012, two pages total, dated Aug. 14, 2012.

International Preliminary Report on Patentability and the Written Opinion dated Nov. 21, 2013, in related International Application No. PCT/US2012/037639.

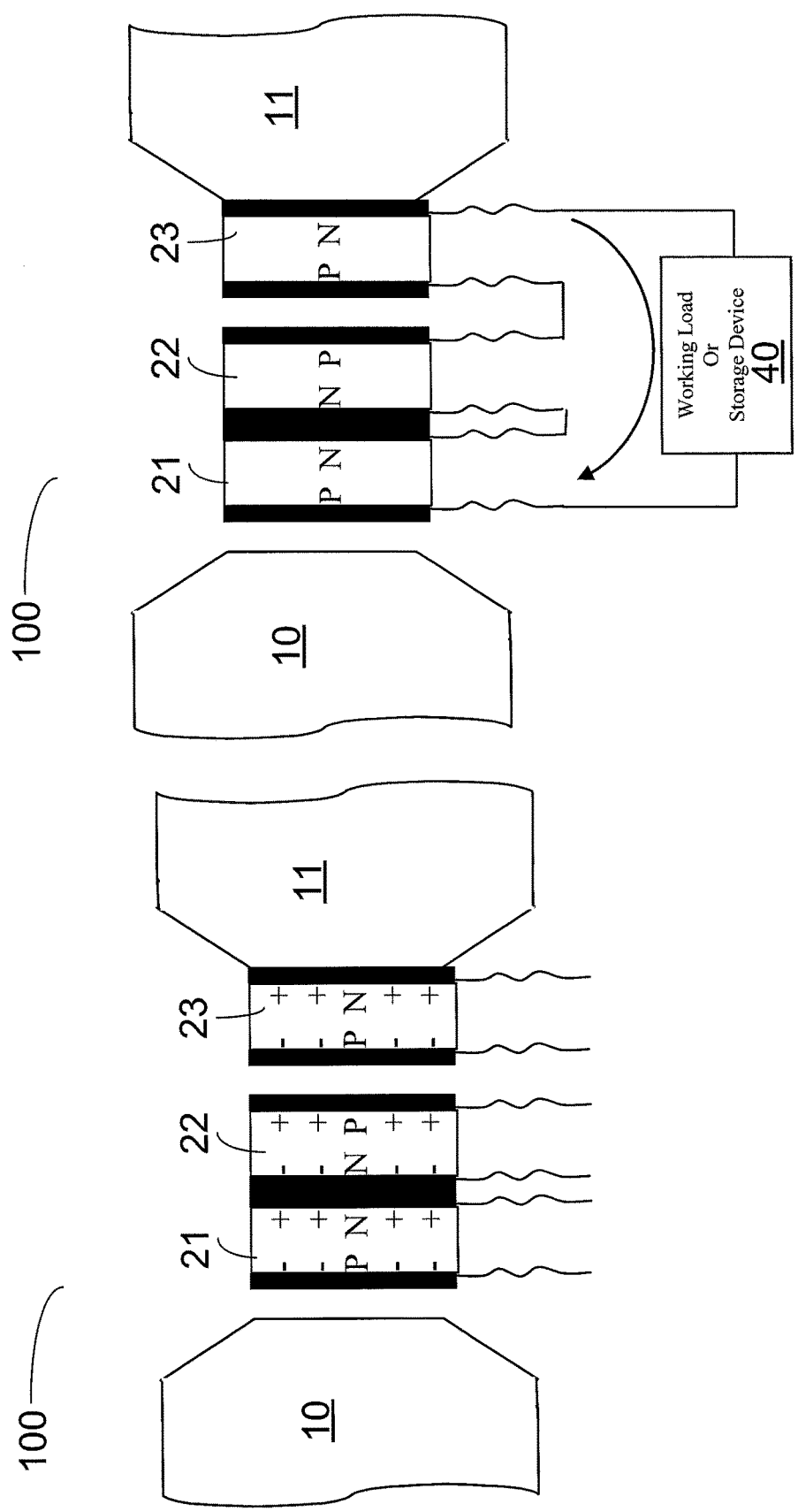

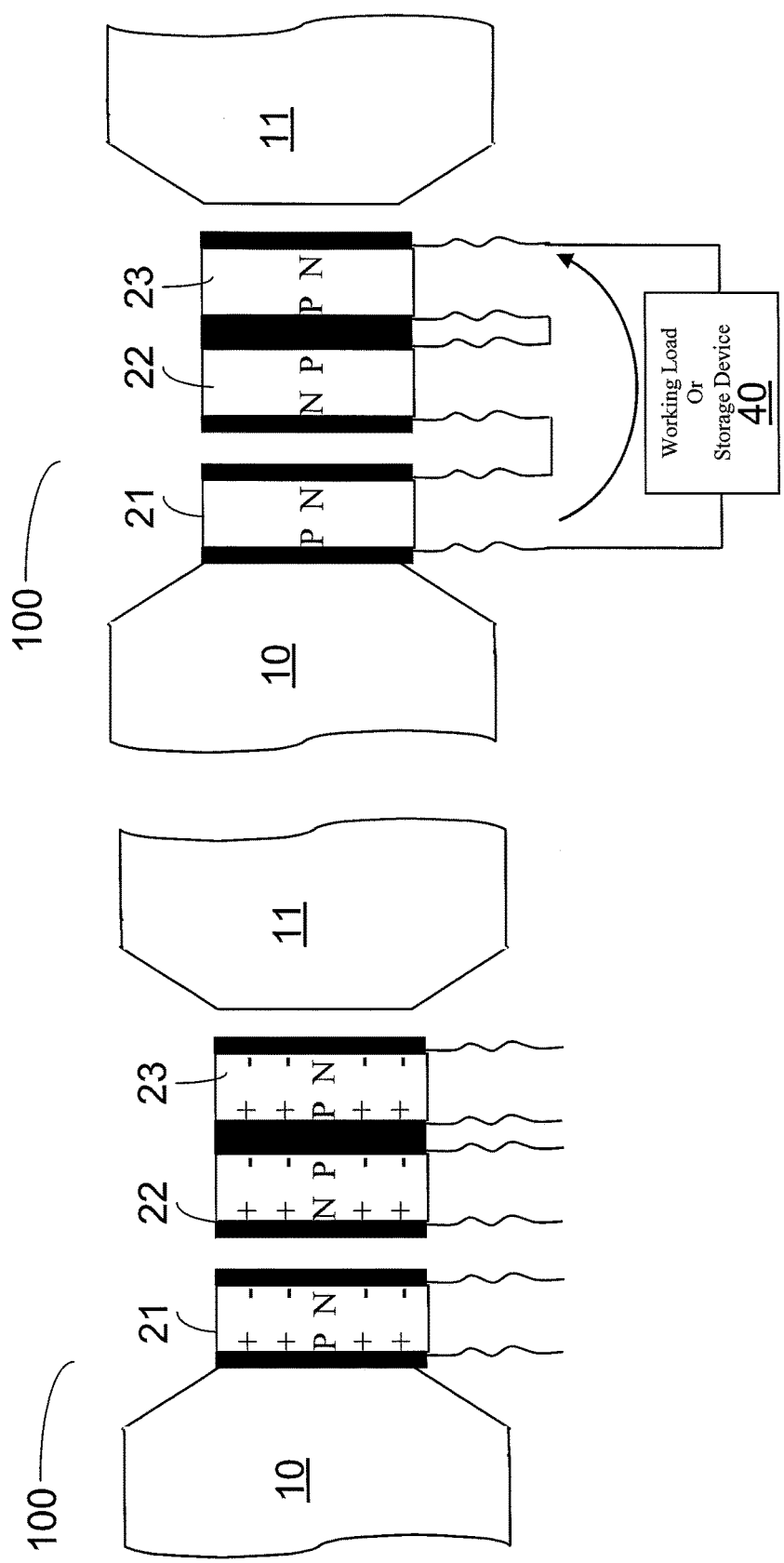

PYROELECTRIC ENERGY PRODUCTION

CROSS-REFERENCE TO RELATED APPLICATIONS

This application relates and claims priority to U.S. Provisional Patent Application No. 61/485,056 filed May 11, 2011 entitled "Pyroelectric Energy Production," by Michael P. Scripsick and Allen Geiger, the disclosure of which is incorporated by reference, in its entirety here for all purposes.

REFERENCE TO GOVERNMENT CONTRACT

This disclosure was developed in part with an Air Force SBIR funding under contract FA8650-10-M-2032. The Government's rights to use, modify, reproduce, release, perform, display, or disclose any technical data or computer software contained in this report are restricted by paragraph (b)(4) of the Rights in Noncommercial Technical Data and Computer Software (Small Business Innovation Research (SBIR) Program clause contained in the above-identified contract (DFARS 252.227-7018 (June 1995)). No restrictions apply after the date shown above. The US Government may have certain rights in the invention.

BACKGROUND

1. Technical Field

Embodiments disclosed herein are directed to conversion of thermal energy to electrical energy using the pyroelectric (PE) and thermodielectric (TD) effects.

While the use of pyroelectric materials for the purpose of electrical power generation was being investigated as early as 1961, the results of these early investigations were not encouraging with regard to the efficiency of thermal-to-electrical energy conversion. Progress has advanced sporadically as interest in alternative energy technologies has waxed and waned over the intervening years. Early efforts were hindered by 1) an incomplete understanding of the fundamental thermodynamics and electrodynamics of the pyroelectric (PE) and thermodielectric (TD) effects under extreme conditions, 2) lack of working designs or models to most appropriately match the most interesting PE and TD materials to particular thermal-to-electrical conversion applications of interest, 3) relatively few PE/TD materials from which to choose, and 4) inadequate characterization of relevant materials properties in the temperature, electric field, and frequency ranges relevant to practical application.

However, several recent theoretical studies and experimental observations of electrical power generation via the pyroelectric effect have suggested that an appropriately designed pyroelectric energy conversion (PEC) device could reach near Carnot efficiencies. Very recently, Sebald et. al demonstrated efficient pyroelectric/thermodielectric energy conversion using ceramic PMN-PT 90/10 with a Curie temperature around 40° C. G. Sebald, S. Pruvost, and D. Guyomar, Energy harvesting based on Ericsson pyroelectric cycles in a relaxor ferroelectric ceramic, Smart Materials and Structures 17, (6 pp.), 2008. An Ericsson cycle was used to harvest energy between 30° C. and 80° C. and applied electric fields as high as 3 kV/mm. The authors noted that without device optimization they were able to harvest 100 times more energy than would normally be calculated based simply on published linear pyroelectric coefficients. Dramatically higher conversion efficiency was attributed to operating in the highly nonlinear region around the Curie temperature. Although the authors interpreted their results primarily in terms of the classical pyroelectric effect, they also likely benefited from the thermodielectric effect and the nonlinear temperature dependence of the electric permittivity (since the thermodynamic cycle operated between temperatures that mostly exceeded the Curie temperature). As relevant PE and TD characterization at the appropriate temperatures, electric fields, and frequencies are scarce, the authors used data from the electro-caloric effect (inverse of the pyroelectric effect) to predict PMN-PT 90/10 ceramic thin films could ultimately harvest energy with 34% of the Carnot efficiency for a 10° C. variation in temperature around 75° C. They similarly predicted that PZT 95/5 could harvest thermal energy with 54% of the Carnot efficiency with a 10° C. variation in temperature around 220° C. While there are a few other examples of investigations using materials similar to PMN-PT and PZT, nearly all of the materials have the disadvantage of having lead as a principle component which raises environmental concerns in manufacturing and deployment. More importantly from a performance point of few is that most of these materials are generally available only in ceramic form. Ceramics lead to lower spontaneous polarizations as the orientation of the dipoles within the material are randomly oriented. In addition, the dielectric breakdown voltage of ceramics is typically an order of magnitude lower than their single crystal counterparts thereby limiting the magnitude of the externally applied electric field which enhances the thermodielectric energy harvesting.

Several other recent investigations have similarly proposed PEC/TDEC power generators based on results obtained using several different materials and thermodynamic cycles. J. Xie, P. P. Mane, C. W. Green, K. M. Mossi, Kam K. Leang *Energy Harvesting By Pyroelectric Effect Using PZT*, Proceedings of SMASIS08, ASME Conference on Smart Materials, Adaptive Structures and Intelligent Systems Oct. 28-30, 2008, Ellicott City, Md., USA, 1, 2008; Gael Sebald, Elie Lefeuvre, and Daniel Guyomar, *Pyroelectric Energy Conversion: Optimization Principles*, IEEE Transactions on ultrasonics, ferroelectrics, and frequency control, vol. 55, no. 3, March 2008; A. S. Mischenko, Q. Zhang, J. F. Scott, R. W. Whatmore, and N. D. Mathur, *A New Approach to Interconversion of Thermal and Electrical Energy*, ICSICT '06. 8th International Conference on *Solid-State and Integrated Circuit Technology*, 2006; Gael Sebald, Sebastien Pruvost and Daniel Guyomar, *Energy harvesting based on Ericsson pyroelectric cycles in a relaxor ferroelectric ceramic*, Smart Mater. Struct. 17 (2008) 015012 (6pp); Randall B. Olsen, and Diane Evans, *Pyroelectric energy conversion: Hysteresis loss and temperature sensitivity of a ferroelectric material*, J. Appl. Phys., 54 5942 (1983); and Lia Kouchachvili, Michio Ikura, *Pyroelectric conversion—Effects of P(VDF-TrFE) preconditioning onpower conversion*, Journal of Electrostatics 65 182 (2007). Nearly all of these investigations have been primarily focused on temperatures only slightly higher than room temperature. The focus on relatively low temperatures arises primarily from the availability of ferroelectric materials with Curie temperatures in this region that have high published values of pyroelectric coefficients, and a particular interest in using PEC/TDEC in low heat applications most notably harvesting waste heat from consumer electronics. In addition to relatively low temperatures, the temperature excursions were also relatively small due to the inherent limitation that the device be operated near its Curie temperature in order to efficiently harvest energy. However, this limitation can be overcome if multiple ferroelectrics can be identified with Curie temperatures that span the temperature range of interest. In this way, a multistage PE/TD energy converter works like a bucket brigade with the highest Curie temperature material efficiently harvesting energy from the heat source with a temperature slightly above its Curie temperature and reducing the temperature to slightly below its Curie temperature. The remaining heat is dumped to the next element with a lower Curie temperature which can efficiently harvest energy in this lower temperature region. This cascade of energy conversion continues through a series of lower Curie temperature elements until the final element with a Curie temperature slightly higher than the cold sink, efficiently harvests energy at the lowest temperature of interest.

Sklar used data from a simple experimental characterization of the ferroelectric $BaTiO_3$ to develop a phenomenological model for thermodielectric materials in general. A. A. Sklar, *A Numerical Investigation of a Thermodielectric Power Generation System*, Ph.D. Dissertation, Georgia Institute of Technology, December, 2005. He then used the phenomenological state equations to parametrically investigate various practical thermodynamic cycles and system configurations (including cascaded multi-element converters with sequential Curie temperatures) to optimize TDEC energy harvesting. Sklar concluded that highly efficient TDEC power generators in the 0° C. to 200° C. range were possible. By employing as many as eight elements in a cascaded converter, thermal to electrical energy conversion could ultimately generate up to 1 MW of power per cubic meter of material with efficiency reaching as high 85% of the Carnot efficiency. However, he also noted that such a system was dependent on the availability of a series of materials with properties similar to $BaTiO_3$ with sequentially higher Curie temperatures that spanned the indicated temperature range and that at present such a series of materials was not known to exist.

Therefore, there is a need for improved PEC/TDEC systems.

SUMMARY

An energy generator according to embodiments disclosed herein may include a material having a Curie temperature; a hot source at a first temperature; a cold sink at a second temperature; a means to thermally couple the hot source to the material while the cold sink is thermally insulated from the material; and a means to thermally couple the cold sink to the material while the hot source is thermally insulated from the material, wherein: the first temperature is higher than the Curie temperature, and the second temperature is lower than the Curie temperature.

In some embodiments, an energy generator may include a hot source at a first temperature; a cold sink at a second temperature; a plurality of elements placed between the hot source and the cold sink, each element including: a material having a Curie temperature; a means to thermally couple the hot source to a first element in the plurality of elements; a means to thermally couple the cold sink to a second element in the plurality of elements; and a means to thermally couple two adjacent elements while insulating the two adjacent elements from the hot source, the cold sink, and the other elements in the plurality of elements, wherein: the elements are cascaded from the hot source to the cold sink in decreasing order of the Curie temperature of the material in each element; and the first temperature is higher than the Curie temperatures of the materials included in the elements, and the second temperature is lower than the Curie temperatures of the materials included in the elements.

Further according to some embodiments a genset having an internal combustion engine for producing electrical energy, a coolant system, an exhaust element, and an alternator, may also have an energy harvester including: a material having a Curie temperature, the material subjected to an electric field; a hot source at a first temperature; a cold sink at a second temperature; a means to thermally couple the hot source to the material while the cold sink is thermally insulated from the material; a means to thermally couple the cold sink to the material while the hot source is thermally insulated from the material; wherein the first temperature is higher than the Curie temperature, and the second temperature is lower than the Curie temperature.

According to some embodiments, an energy generator may include a hot source having a first temperature; a cold sink having a second temperature; and a material configured to be thermally coupled to at least one of the hot source and the cold sink, the material being subjected to an electric field and having a Curie temperature that is less than the first temperature and higher than the second temperature, wherein the material is further configured to: transfer thermal energy from the hot source when the material is thermally coupled to the hot source and thermally insulated from the cold sink; and transfer thermal energy to the cold sink when the material is thermally coupled to the cold sink and thermally insulated from the hot sink.

According to some embodiments, a method for harvesting energy using a pyroelectric energy production cycle may include: placing a material between a hot source and a cold sink; thermally insulating the material from the cold sink; thermally coupling the material to the hot source; allowing the material and the hot source to reach equilibrium at a first temperature; thermally insulating the material from the hot source; thermally coupling the material to the cold sink; allowing the material and the cold sink to reach equilibrium at a second temperature; and closing a circuit formed by a first surface electrode on a first side of the material, a second surface electrode on a second side of the material, and an external load, wherein: the material has a Curie temperature lower than the first temperature and higher than the second equilibrium temperature.

These and other embodiments of the some embodiments are further described below.

BRIEF DESCRIPTION OF THE FIGURES

FIGS. 15A-E illustrate a simple example of thermal cycling and energy harvesting in a cascaded PEC/TDEC energy harvester, according to some embodiments.

In the figures, like elements have the same or like reference numerals.

DETAILED DESCRIPTION

Figure 1:
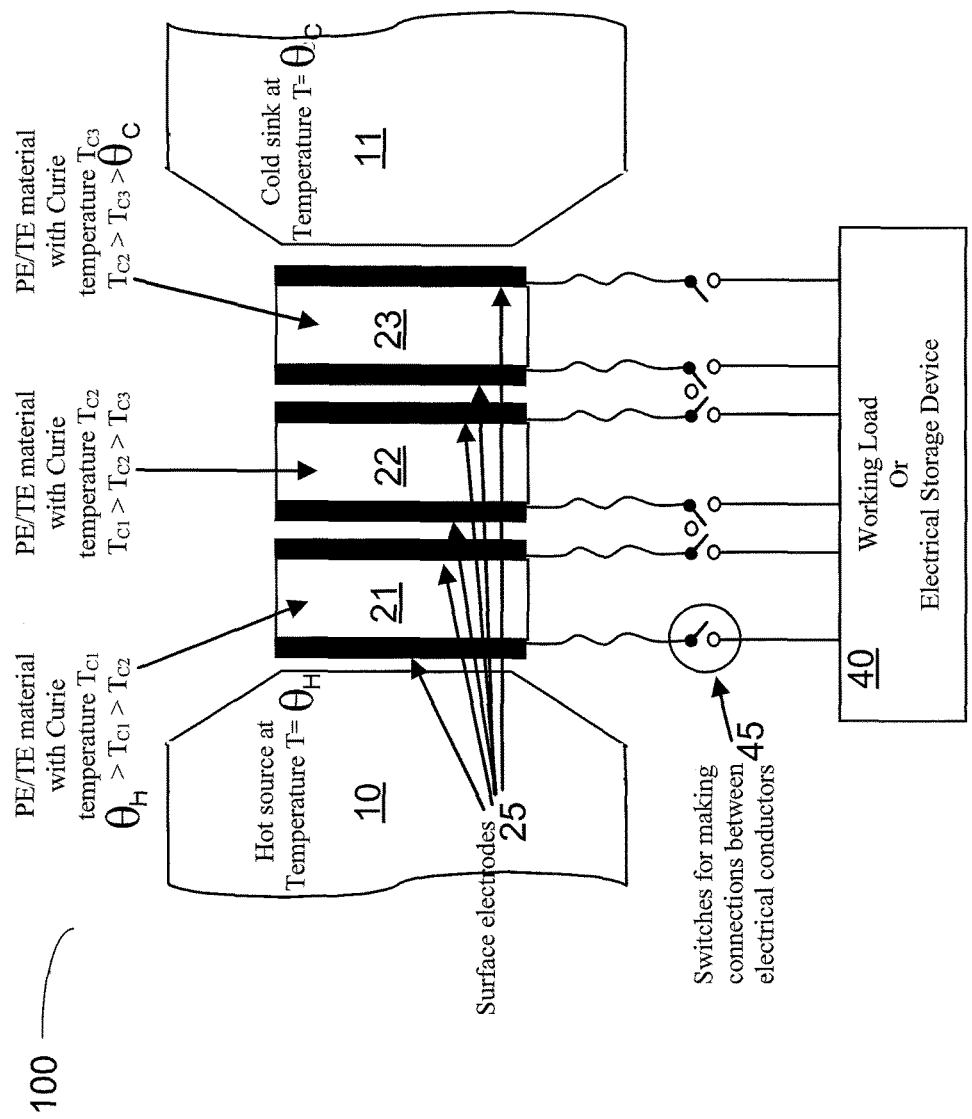
FIG. 1 illustrates a cascaded PEC/TDEC power generation device according to some embodiments.

In accordance with some embodiments, an energy generator utilizing pyroelectric energy conversion (PEC) and thermodielectric energy conversion (TDEC) are presented. In some embodiments, the energy generator operates with very high efficiency and includes a heat source, a cold sink and materials that undergo a phase transition from a ferroelectric phase to a paraelectric phase when cycled between the cold sink temperature and the heat source temperature. In some embodiments an external electric field is applied to increase energy harvesting via the thermodielectric effect. In some embodiments the material is a single crystal. In some embodiments, the ferroelectric material is Strontium Barium Niobate ($Sr_xBa_{1-x}Nb_2O_6$). In some embodiments the Strontium Barium Niobate is doped with Sodium. In some embodiments, the ferroelectric material is Lithium Niobate ($LiNbO_3$) and or Lithium Tantalate ($LiTaO_3$) and/or mixed solid solutions of these ($LiNb_{1-x}Ta_xO_3$).

This disclosure relates to utilizing selected ferroelectric/paraelectric materials for energy scavenging applications based on the pyroelectric (PE) and thermodielectric (TD) effects. Maximizing energy efficiency is important in applications where traditional energy delivery is hampered by local conditions. Energy delivery to many military applications is problematic where the power consuming installation is temporary in position, is located far from traditional energy sources, and/or delivery is hampered by a hostile environment (physically inaccessible due to terrain or hostile forces). In such cases delivery of traditional energy sources can be extremely costly or jeopardize mission objectives or personnel safety. The significance of maximizing energy efficiency in general and energy scavenging in particular has become increasingly apparent in recent years due to extreme volatility in traditional energy markets as well as the growing need for reduction in carbon emissions to address the issue of global climate change. While the economic and geopolitical turmoil that results from global dependence on limited energy resources has peaked and receded several times in the past century, the now commonly accepted realization that global reliance on hydrocarbon based energy threatens catastrophic climate change makes the development of high efficiency and alternative energy strategies critical. The emphasis on developing and encouraging alternative energy strategies through direct funding of developmental programs and through tax and regulatory incentives makes alternative energy an attractive commercial enterprise for the foreseeable future. Electrical power generation via PEC/TDEC has the potential to be an effective and efficient source of nonpolluting electrical energy in general and can specifically be employed in applications where no other alternative energy approach is suitable. Pyroelectric energy conversion and thermodielectric energy conversion (PEC/TDEC) provides a mechanism by where low grade waste heat can be effectively and efficiently captured and converted into usable electrical energy.

The following description details the principles of PEC/TDEC, including a description of the physical principles involved, an analytical expression relating the total energy harvested and efficiency of energy harvesting to measurable materials properties, how it compares to other methods of energy harvesting, and embodiments of devices for energy harvesting, and embodiments of devices for energy harvesting utilizing PEC/TDEC.

FIG. 1 illustrates a cascaded PEC/TDEC power generation device 100 according to some embodiments. Cascaded PEC/TDEC operates between a hot source 10 at a hot temperature $\theta_H$ and a cold sink 11 at a cold temperature $\theta_C$. The power generation device includes at least one and possibly multiple PEC/TDEC elements 21, 22, and 23, each including a PE/TD material with surface electrodes on the polar surfaces of the material. The surface electrodes 25 are electrically connected to each other or to the electrical load or storage device via electrical switches 45 which can be opened and closed at appropriate times in the thermal to electrical conversion cycle. The PEC/TDEC element 21 with the highest Curie temperature has a Curie temperature that lies between the hot source temperature ($\theta_H$) and the Curie temperature of its nearest neighbor PEC/TDEC element. The PEC/TDEC element with the lowest Curie temperature has a Curie temperature that lies between the Curie temperature of its nearest neighbor PEC/TDEC element and the temperature of the cold sink ($\theta_C$). Each intermediate PEC/TDEC element is characterized by a Curie temperature $T_C$ that lies between the Curie temperatures of its two nearest neighbors PEC/TDEC elements.

The PEC/TDEC element with the highest Curie temperature (21) is thermally cycled between a hot temperature that is equal to the hot source temperature and a cold temperature that lies between its Curie temperature $T_{C1}$ and the Curie temperature of its nearest neighbor $T_{C2}$. The PEC/TDEC element with the lowest Curie temperature is thermally cycled between a cold temperature that is equal to the cold sink temperature and a hot temperature that lies between its Curie temperature $T_{C3}$ and the Curie temperature of its nearest neighbor $T_{C2}$. Each intermediate PEC/TDEC elements is thermally cycled between temperatures that lie between its Curie temperature and the Curie temperature of its two nearest neighbors. Thermal cycling can be accomplished via conduction, convection, or radiation. Heating of a specific PEC/TDEC element is accomplished by increasing the conductivity, transmissivity, or convective flow from the hotter nearest neighbor while decreasing the conductivity, transmissivity, or convective flow to the cooler nearest neighbor. Cooling of a specific PEC/TDEC element is accomplished by decreasing the conductivity, transmissivity, or convective flow from the hotter nearest neighbor while increasing the conductivity, transmissivity, or convective flow to the cooler nearest neighbor.

According to some embodiments, the PEC/TDEC elements are thermally cycled by first thermally coupling each of the PEC/TDEC elements alternatively with a hot source while the cold sink is thermally insulated from the PEC/TDEC element; then, the PEC/TDEC may be thermally coupled to the cold sink while the hot source is thermally insulated from the material. In cascaded device 100 the process may be continued by first thermally coupling a PEC/TDEC element having a Curie temperature $T_{Ci}$ with an adjacent PEC/TDEC element at a temperature higher than $T_{Ci}$ while thermally insulating the PEC/TDEC element having the Curie temperature $T_{Ci}$ with an adjacent PEC/TDEC element at a temperature lower than $T_{Ci}$. Then, the PEC/TDEC element having Curie temperature $T_{Ci}$ may be thermally insulated from the PEC/TDEC element at a temperature higher than $T_{Ci}$, and thermally coupled to the PEC/TDEC element at a temperature lower than $T_{Ci}$.

Thermally coupling and insulating a PEC/TDEC element as described above may be performed by a conductive configuration, a radiative configuration, or a convective configuration. For example, a conductive configuration providing a thermal coupling to a PEC/TDEC element may move the PEC/TDEC element into contact and out of contact with a hot source, another PEC/TDEC element, or a cold sink. Movement to a PEC/TDEC element may be provided mechanically, by gravity, by an electromagnetic field, or by a pneumatic force.

In some embodiments, the power generation devices of FIG. 1 employ pyroelectric and thermodielectric effects to efficiently convert thermal energy to electrical energy. According to some embodiments, PEC/TDEC elements 21, 22, and 23 include materials with a high spontaneous polarization. In some embodiments both the spontaneous polarization and the electric permittivity of the PEC/TDEC elements can change rapidly with temperature. These conditions are generally satisfied only in a narrow temperature range around the material's Curie temperature ($T_C$, temperature of ferroelectric/paraelectric phase transition). As such, for efficient energy harvesting over a broad and practical temperature region, the PEC/TDEC elements may be comprised of multiple individual elements each with a sequentially lower Curie temperature arranged such that the highest Curie temperature element is nearest to the hot source 10 while the lowest Curie temperature element is nearest to the cold sink 11.

In some embodiments the material included in a PEC/TDEC element is a single crystal. In some embodiments, the ferroelectric material is Strontium Barium Niobate ($Sr_xBa_{1-x}Nb_2O_6$) whereby the Curie temperature ranges from about 50° C. to about 200° C. In some embodiments the Strontium Barium Niobate is doped with Sodium. In some embodiments, the ferroelectric material is Lithium Niobate ($LiNbO_3$) and or Lithium Tantalate ($LiTaO_3$) and/or mixed solid solutions of these ($LiNb_{1-x}Ta_xO_3$). In some embodiments the material is a single crystal.

In some embodiments, the PEC/TDEC material is Strontium Barium Niobate ($Sr_xBa_{1-x}Nb_2O_6$) whereby the Curie temperature can be varied from approximately 50° C. to approximately 200° C. by changing the value of x.

In some embodiments the Strontium Barium Sodium Niobate whereby the Curie temperature can be increased to over approximately 500° C.

In some embodiments, the ferroelectric material is Lithium Niobate ($LiNbO_3$) and or Lithium Tantalate ($LiTaO_3$) and/or mixed solid solutions of these ($LiNb_{1-x}Ta_xO_3$) whereby the Curie temperature can be varied from about 550° C. to over approximately 1200° C. by varying the value of x.

Figure 2:
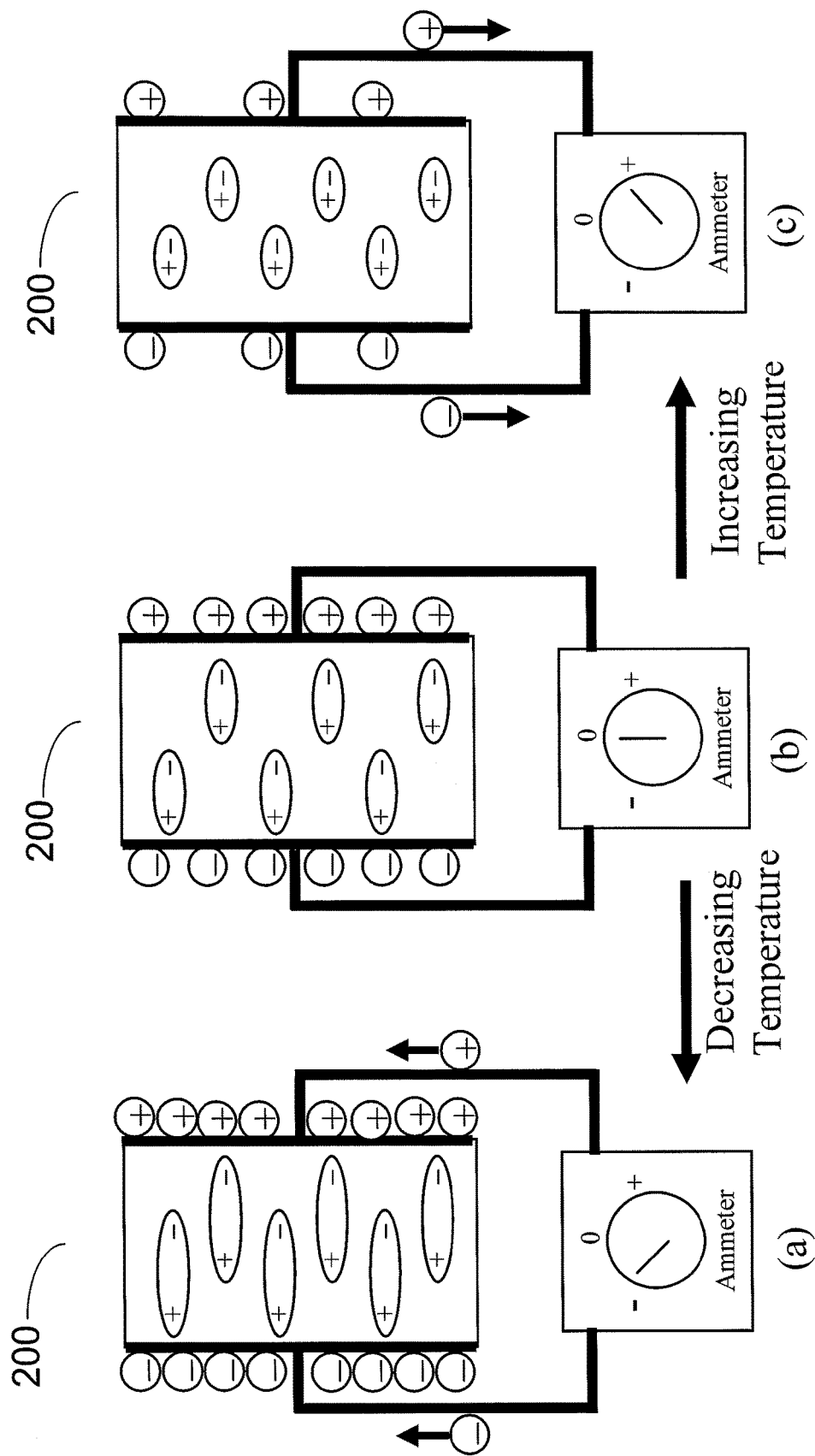
FIG. 2 illustrates a pyroelectric current generated as spontaneous polarization changes with changing temperature, according to some embodiments.

FIG. 2 illustrates a pyroelectric current generated as spontaneous polarization changes with changing temperature in a PEC/TDEC element 200, according to some embodiments. The pyroelectric effect has been a well known phenomenon since the 1700's. Pyroelectricity is defined as the temperature dependence of the spontaneous polarization of certain anisotropic materials. Some non-centrosymmetric materials (lacking inversion symmetry) have ions arranged so as to give rise to a dipole moment even in the absence of an externally applied field. The dipole moment per unit volume of material is called the spontaneous polarization ($P_S$). Externally, no electric field is detected (the material does not align itself when free to rotate within an external electric field). The lack of an external polarization arises from the fact that charges collect on the surface of the material (from its surroundings) which exactly balances the internal field thereby canceling any observable external field from the material. The surface charge is bound by the spontaneous polarization so that if the two opposing surfaces are connected through a conductive circuit, no transfer of charge is observed (see section (b) in FIG. 2).

However, if the temperature of the material is changed, then the positions of the ions within the material change relative to one another resulting in a change in $P_S$. The most common and simplest expression for this change is given by $$p = \frac{dP_S}{d\theta}, \qquad \text{Eqn. 1}$$

where θ is the absolute temperature measured in Kelvin and p is defined as the pyroelectric coefficient. As $P_S$ changes, the amount of surface charge required to cancel the internal field is either reduced or increased depending on whether the material is heated or cooled. The charge that is added or subtracted from the surfaces can then be measured as it moves through a circuit connecting the two opposing surfaces (see sections (a) and (c) in FIG. 2). The current flows in one direction when the temperature is increasing and flows in the opposite direction when the temperature is decreasing. When the net charge transferred from one surface to the other is sufficient to balance the internal field, the current stops. Thus, current is generated only when the temperature is changing. The change in charge (q) divided by the area is equal to the change in $P_S$ so that the current (I) through the circuit can be expressed as $$I = \frac{dq}{dt} = \frac{dP_S}{dt} = p\frac{d\theta}{dt} \qquad \text{Eqn. 2}$$

The most common application of pyroelectricity is in the manufacture of pyroelectric detectors commonly employed in the detection of infrared (IR) radiation. While advances in pyroelectric detectors continue today, they have been in use since the 1960's. Applications include intrusion detectors and burglar alarms, flame and fire detectors, IR spectrometers, laser detectors, and pollution monitors. Pyroelectric detectors are typically very low power devices. They are commonly used to detect very low intensity IR radiation (temperature changes less than 100 miliKelvin (mK) are commonly detected) and typically employ amplifier circuitry to boost the weak signal, as described in e.g., S. B. Lang, *Pyroelectricity: From Ancient Curiosity to Modern Imaging Tool*, Physics Today, pp. 31-36, August 2005. As such, they have generally been considered inadequate for generation of electrical power from thermal sources. The highest reported values of pyroelectric coefficients are generally in ferroelectric materials. Using the reported pyroelectric coefficients for common materials in the expression above combined with realistic values for the rate of temperature change, the harvested electric energy from a pyroelectric material is too low to be of interest as a power source. However, the simple definition of the pyroelectric coefficient in Eqn. 1 is inadequate to describe the change in spontaneous polarization for large temperature changes, extremes in temperature (near the material's Curie temperature) or for very high values of electric field.

Figure 3:
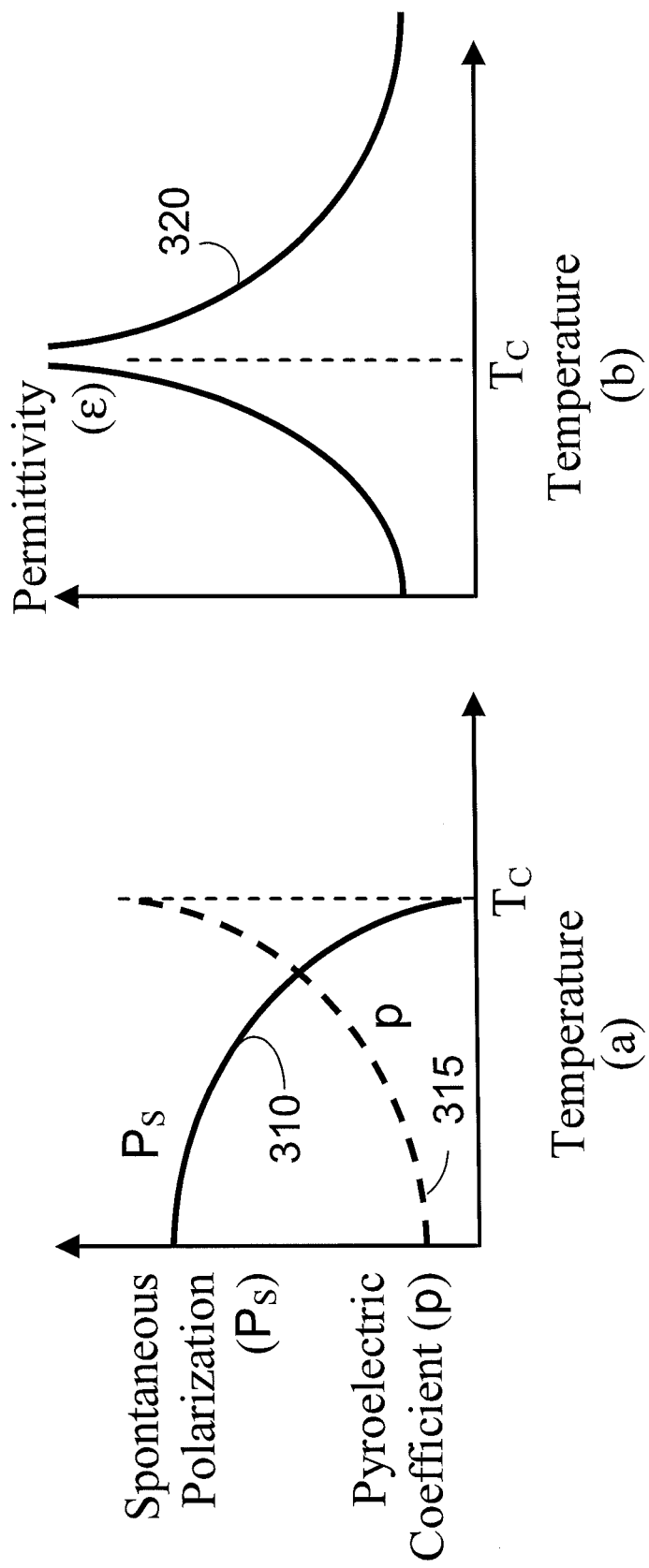
FIG. 3 illustrates the temperature dependence near the Curie temperature of (a) spontaneous polarization and pyroelectric coefficient, and (b) electric permittivity, according to some embodiments.

FIG. 3 illustrates the temperature dependence near the Curie temperature of (a) spontaneous polarization 310 and pyroelectric coefficient 315, and (b) electric permittivity 320, according to some embodiments. One characteristic of ferroelectric materials is that at sufficiently high temperature (defined as the Curie temperature, $T_C$), the material undergoes a phase change from a ferroelectric phase to a paraelectric phase. As the temperature of a ferroelectric material is increased, initially its spontaneous polarization decreases only slightly (pyroelectric coefficient is small). But, as the temperature nears the Curie temperature, the spontaneous polarization drops rapidly (pyroelectric coefficient is large) until it reaches zero at $T_C$ (FIG. 3a). As a result, large temperature excursions near (but below) $T_C$ produce large pyroelectric currents that can be efficiently harvested for electrical power.

Since the pyroelectric coefficient changes rapidly with temperature near $T_C$, Eqn. 2 cannot be used to accurately predict the current harvested for large temperature excursions near the Curie temperature. An alternative model is to think of the pyroelectric material within a parallel plate capacitor. The energy stored on a parallel plate capacitor is given by:

$$E = \frac{1}{2}\frac{Q^2}{C} \qquad \text{Eqn. 3}$$

where Q is the charge on the capacitor and C is the capacitance. The charge on the capacitor is given by the change in polarization (from FIG. 3(a)) multiplied by the area so that:

$$Q = \Delta P_S A \qquad \text{Eqn. 4}$$

It should be noted that the permittivity and, thus, capacitance also changes with temperature as in FIG. 3(b) according to:

$$C = \varepsilon_r \varepsilon_o \frac{A}{d} \qquad \text{Eqn. 5}$$

where $\varepsilon_o$, $\varepsilon_r$, A, and d are the permittivity of free space, the relative permittivity, the area, and the thickness of the dielectric capacitor.

Figure 4:
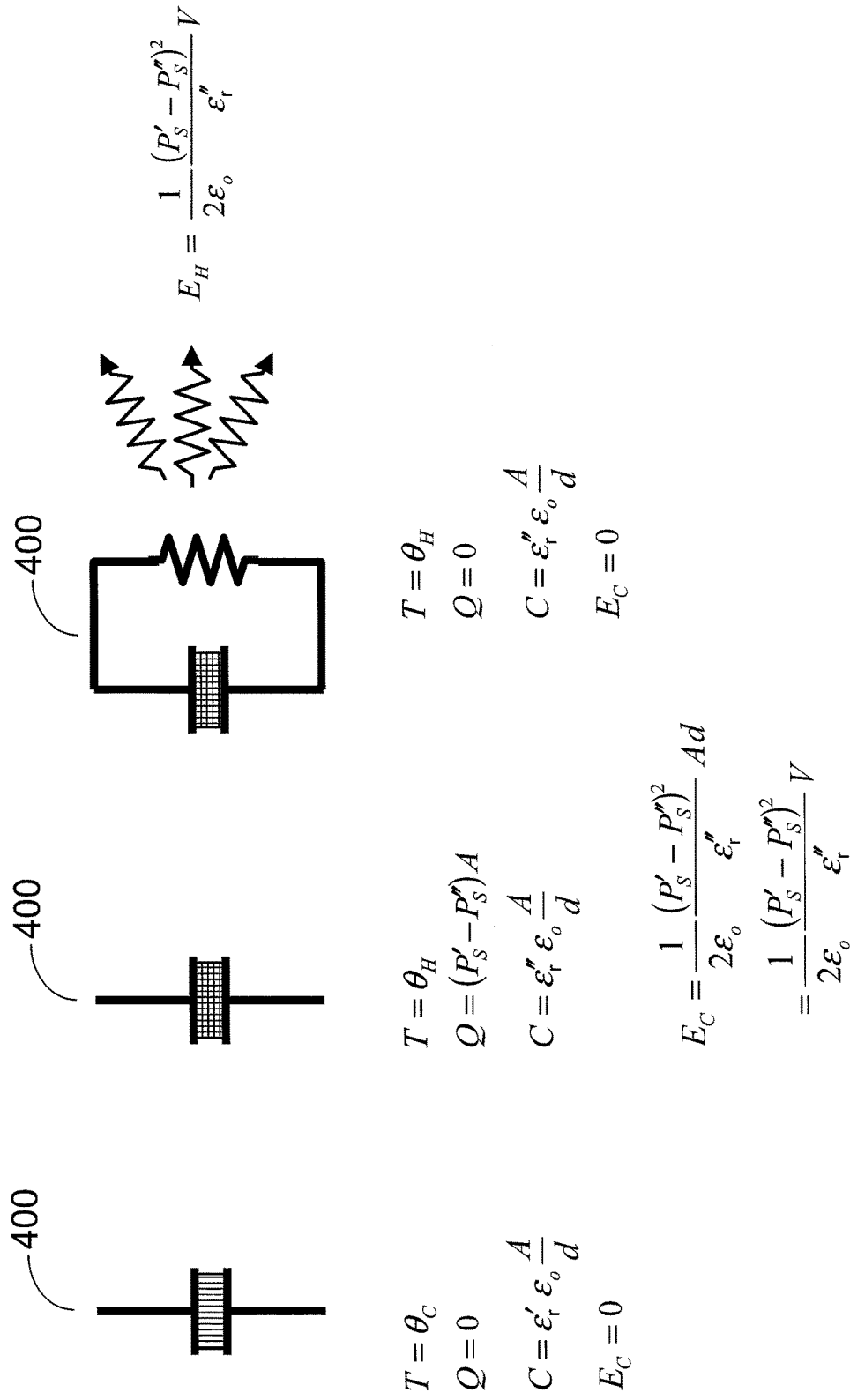
FIG. 4 illustrates a simple half-cycle for pyroelectric energy harvesting, according to some embodiments.

FIG. 4 illustrates a simple energy harvesting cycle, according to some embodiments. The cycle begins with an uncharged pyroelectric capacitor 400 at low temperature $\theta_C$ that is below $T_C$. With no free charge, the energy of the capacitor 400 is zero. If the capacitor 400 is then heated to some higher temperature $\theta_H$, the spontaneous polarization decreases and some of the bound charge is freed. Knowing the temperature dependence of the spontaneous polarization 310 (see section (a) in FIG. 3) the amount of free charge can be calculate using Eqn. 4. If the temperature dependence of the permittivity 320 (see section (b) in FIG. 3) is also known then the capacitance can be calculated using Eqn. 5. Having determined both the charge and capacitance of the thermally charged capacitor the energy stored on the capacitor can be calculated using Eqn. 3.

A similar analysis can be followed for cooling the pyroelectric capacitor to its original temperature with the total energy harvested per unit volume for the complete cycle (heating then cooling to the original temperature) given by:

$$E_H = \frac{(P'_S - P''_S)^2}{2\varepsilon_o}\left(\frac{1}{\varepsilon'_r} + \frac{1}{\varepsilon''_r}\right) \qquad \text{Eqn. 6}$$

where ' and " denote values at the cold and hot temperatures respectively.

The thermal efficiency of the energy harvesting cycle is then given by the energy harvested (Eqn. 6) divided by the thermal energy required to heat the crystal to the desired temperature. This is easily calculated via the volume heat capacity ($C_V$). Recognizing that the heat capacity of most materials is relatively uniform over the temperature ranges of interest, the thermal efficiency of a PEC energy harvester can be given by:

$$\eta_{PEC} = \frac{(P'_S - P''_S)^2}{2C_V \Delta \theta}\frac{1}{\varepsilon_o}\left(\frac{1}{\varepsilon'_r} + \frac{1}{\varepsilon''_r}\right) \qquad \text{Eqn. 7}$$

where $\Delta\theta$ is the temperature difference between the hot and cold temperatures measured in Kelvin. It should be noted that all thermal energy harvesting methods are limited by the maximum efficiency defined by the Carnot efficiency:

$$\eta_{Carnot} = \frac{\theta_H - \theta_C}{\theta_H} \qquad \text{Eqn. 8}$$

where $\theta_H$ and $\theta_C$ are the temperature of the hot source and cold sink measured in Kelvin. The PEC conversion efficiency relative to the Carnot efficiency can then be calculated by:

$$\frac{\eta_{PEC}}{\eta_{Carnot}} = \left(\frac{(P'_S - P''_S)^2}{\Delta\theta}\right)^2 \frac{\theta_H}{2C_V} \frac{1}{\varepsilon_o}\left(\frac{1}{\varepsilon'_r} + \frac{1}{\varepsilon''_r}\right) \qquad \text{Eqn. 9}$$

For infinitesimally small temperature changes, the term $(\Delta P_S/\Delta\theta)$ in Eqn. 9 is simply the pyroelectric coefficient (Eqn. 1) at that temperature. However, use of published pyroelectric coefficients as a guide to the PEC energy harvesting capacity of a material can lead to erroneous results and conclusions. Pyroelectric coefficients in published tabulations are generally measured at room temperature. As noted earlier, the pyroelectric coefficients are temperature dependent so that extrapolation of room temperature pyroelectric coefficients to broad temperature harvesting cycles far from room temperature is likely to be inaccurate. In addition, from Eqns. 7 and 9 it can be noted that the highest efficiencies are obtained for large changes in spontaneous polarization over small temperature ranges. This occurs most distinctly near a ferroelectric material's Curie temperature where the pyroelectric coefficient is changing the most rapidly. Ultimately, accurate prediction of the energy harvesting capacity of a particular pyroelectric material requires detailed determination of the spontaneous polarization and permittivity as a function of temperature with the most important relationships being near the materials Curie temperature. Unfortunately such information is not readily available for many materials of interest.

The above simple description of pyroelectric energy harvesting via capacitive discharge is only one example of potential energy harvesting cycles. Pyroelectric energy harvesting can be analyzed within the more general context of thermodielectric energy harvesting as follows.

The work done on a dielectric by an applied electric field is given by:

$$dW = \mathscr{E}\, dP\mathscr{E} \qquad \text{Eqn. 10}$$

where E is the applied electric field and $P_E$ is the induced polarization. For a classical dielectric material, the induced polarization is given by:

$$P\mathscr{E} = \chi_e \varepsilon_o \mathscr{E} = \varepsilon_o(\varepsilon_r - 1)\mathscr{E} \qquad \text{Eqn. 11}$$

where $\chi_e$ is the electric susceptibility, $\varepsilon_o$ is the vacuum permittivity, and $\varepsilon_r$ is relative permittivity. Substituting Equation 11 into Equation 10 and integrating, the work done on the dielectric can be expressed as:

$$W = \frac{1}{2}\chi_e\varepsilon_o(\Delta\mathscr{E})^2 + \frac{1}{2}\varepsilon_o(\varepsilon_r - 1)(\Delta\mathscr{E})^2 \qquad \text{Eqn. 12}$$

When the dielectric material is also pyroelectric, the spontaneous polarization ($P_S$) must be added to Equations 11 and 12 so that the polarization and work done on the pyroelectric material is given by:

$$P = P_S + P\mathscr{E} = P_S + \varepsilon_o(\varepsilon_r - 1)\mathscr{E} \qquad \text{Eqn. 13}$$

$$W = P_S(\Delta\mathscr{E}) + \frac{1}{2}\varepsilon_o(\varepsilon_r - 1)(\Delta\mathscr{E}^2) \qquad \text{Eqn. 14}$$

Equation 14 can be similarly used to calculate the work done by the pyroelectric material when the electric field is removed. At constant temperature the work done by the dielectric is equal to the work done on the dielectric and no net energy change is observed. However, as noted in FIG. 3, both the spontaneous polarization 310 and permittivity 320 change rapidly and nonlinearly in the region near the material's Curie temperature $T_C$. As such, by changing the temperature, the work done by the dielectric can be larger than the work done on the dielectric. The difference in work is the thermal energy that was converted to electrical energy in the process. Graphically this can be depicted as in FIG. 5 where the energy harvested is given by the area of the enclosed thermodynamic cycle (shaded area, in dark and light gray). The thermodynamic cycle in this example is an Ericsson cycle consisting of isothermally increasing the applied electric field (1→2) at high temperature, then isentropically (constant electric field) cooling the material (2→3), followed by isothermally reducing the electric field (3→4) at the cold temperature, and finally isentropically heating the material to its original temperature with no applied field (4→1).

Figure 5:
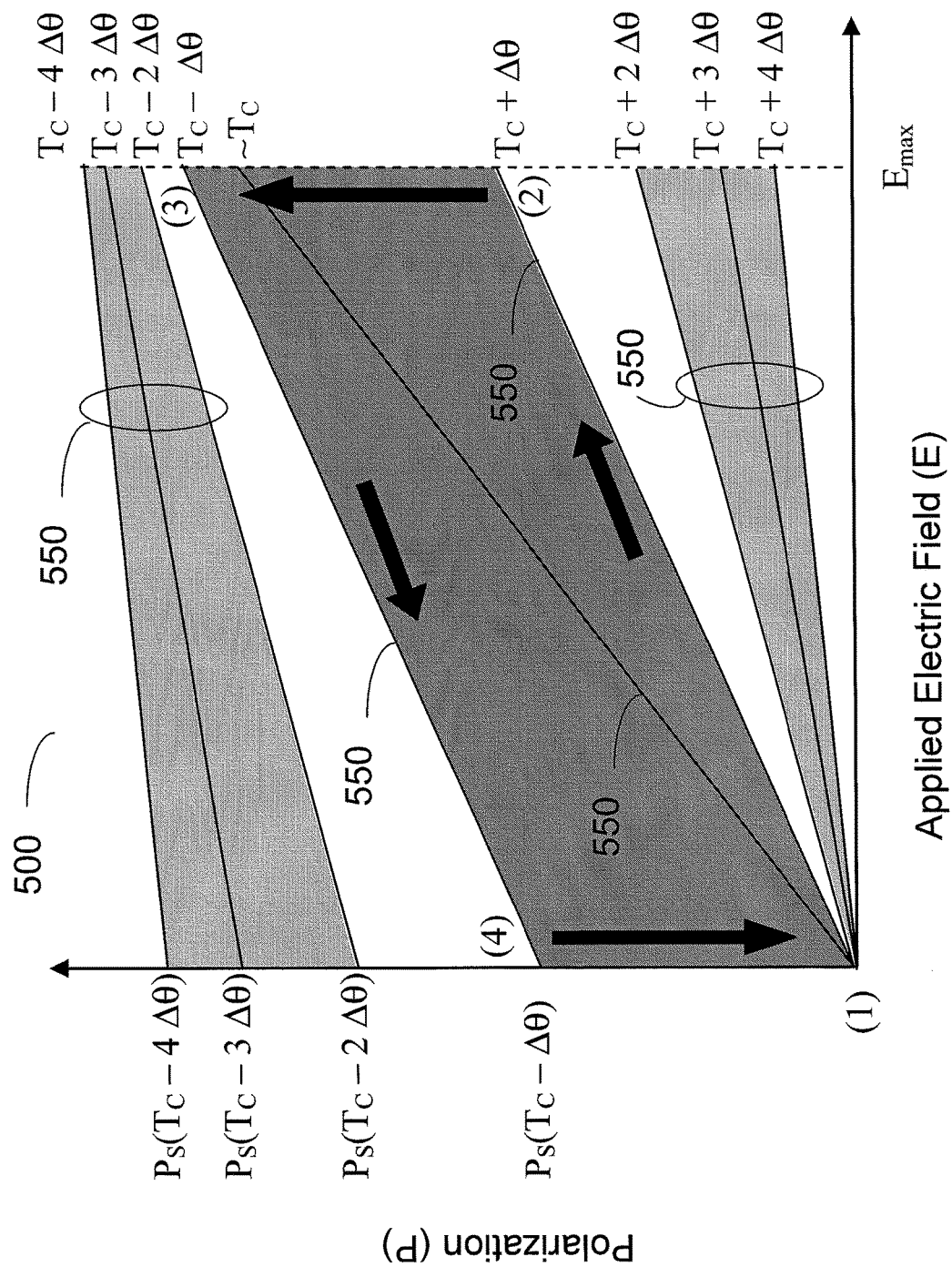
FIG. 5 illustrates an Ericsson cycle for energy harvesting using a ferroelectric material above and below $T_C$, according to some embodiments.

FIG. 5 illustrates an Ericsson cycle 500 for energy harvesting using a ferroelectric material above and below $T_C$, according to some embodiments. The lines 550 plotted in FIG. 5 represent isothermal relations between total polarization and applied electric field (including both spontaneous and induced polarization) at several temperatures near the Curie temperature of a material. For temperatures farther from $T_C$ ($T_C \pm 4\Delta\theta$), the slope of P vs. E is small due to the lower electric permittivity (see section (b) of FIG. 2). More significantly, at temperatures far from $T_C$, as the temperature is incrementally changed by $\Delta\theta$, the slope of the corresponding P vs E plot changes only slightly due to the fact that the electric permittivity is changing slowly at temperatures far from $T_C$. Accordingly, the slope at $T_C \pm 4\Delta\theta$ is only slightly smaller than the slope at $T_C \pm 3\Delta\theta$. However, since the electric permittivity is increasing rapidly near the Curie temperature, the slope of P vs E increases more rapidly for an equivalent temperature change of $\Delta\theta$ (the slope at $\sim T_C$ is much greater than the slope at $T_C + \Delta\theta$). As such, choosing the cold temperature below $T_C$ so that it has a higher permittivity (higher slope) than the hot temperature above $T_C$ tends to increase the area within the cycle since the two P vs E plots tend to move apart as the field is increased.

For temperatures below the phase transition, a similar nonlinear and rapidly changing spontaneous polarization (see section (a) of FIG. 3). also acts to increase the area within the thermodynamic cycle near $T_C$. At temperatures far from $T_C$, as the temperature is incrementally changed by $\Delta\theta$, the spontaneous polarization ($P_S$) changes only slightly ($P_S$ at $T_C - 4\Delta\theta$ is only slightly larger than $P_S$ at $T_C - 3\Delta\theta$). However, since the spontaneous polarization is decreasing rapidly near the Curie temperature, $P_S$ decreases more rapidly for an equivalent temperature change of $\Delta\theta$ ($P_S$ at $T_C - \Delta\theta$ is much larger than $P_S$ at $T_C$).

As can be seen from FIG. 5, the area enclosed by two isothermal and two isentropic paths operating between temperatures separated by 2 $\Delta\theta$ around $T_C$ (dark gray area of FIG. 5) is much greater than the area enclosed by similar thermodynamic cycles operating around a temperature that is farther from $T_C$ (light gray area of FIG. 5). While increasing the temperature range of the thermodynamic cycle ($T_C - 4\Delta\theta$ to $T_C + 4\Delta\theta$ for example) would increase the harvested energy (the total enclosed area would be larger) this comes at the expense of decreased efficiency as each incremental increase in $\Delta\theta$ (requiring nearly the same absorbed heat energy) adds a smaller incremental increase in the enclosed area (smaller harvested energy). It can be shown that the enclosed area of FIG. 5 (energy harvested per unit volume) is given by:

$$E_H = \Delta W = (P'_S - P''_S)(\Delta \mathscr{E}) + \frac{1}{2}\varepsilon_o(\varepsilon'_r - \varepsilon''_r)(\Delta \mathscr{E}^2) \quad \text{Eqn. 15}$$

where ' and " denote values at the cold and hot temperature respectively.

The thermal efficiency can be calculated by dividing by the product of the volume heat capacity and temperature difference in a manner similar to Equation 7. Likewise, the relative Carnot efficiency can be calculated by dividing the thermal efficiency by the change in temperature and multiplying by the hot temperature in a manner similar to Equation 9. The energy harvested, thermal efficiency, and relative Carnot efficiency per thermal cycle for the two thermal cycles described above (capacitive discharge and Ericsson) are summarized in the table below.

TABLE 1

PEC/TDEC energy harvesting equations.

| | Capacitor Discharge | Ericsson |
|---|---|---|
| $E_H$ | $\frac{\Delta P_S^2}{2\varepsilon_o}\left(\frac{1}{\varepsilon'_r} + \frac{1}{\varepsilon''_r}\right)$ | $(P'_S - P''_S)(\Delta \mathscr{E}) + \frac{1}{2}\varepsilon_o(\varepsilon'_r - \varepsilon''_r)(\Delta \mathscr{E}^2)$ |
| $\eta_{PEC}$ | $\frac{\Delta P_S^2}{2C_V \Delta \theta}\frac{1}{\varepsilon_o}\left(\frac{1}{\varepsilon'_r} + \frac{1}{\varepsilon''_r}\right)$ | $\frac{1}{C_V \Delta \theta}\left\{(P'_S - P''_S)(\Delta \mathscr{E}) + \frac{1}{2}\varepsilon_o(\varepsilon'_r - \varepsilon''_r)(\Delta \mathscr{E}^2)\right\}$ |
| $\frac{\eta_{PEC}}{\eta_{Carnot}}$ | $\left(\frac{\Delta P_S}{\Delta \theta}\right)^2 \frac{\theta_H}{2C_V}\frac{1}{\varepsilon_o}\left(\frac{1}{\varepsilon'_r} + \frac{1}{\varepsilon''_r}\right)$ | $\frac{\theta_H}{C_V (\Delta \theta)^2}\left\{(P'_S - P''_S)(\Delta \mathscr{E}) + \frac{1}{2}\varepsilon_o(\varepsilon'_r - \varepsilon''_r)(\Delta \mathscr{E}^2)\right\}$ |

From the above analysis, it can be seen that the pyroelectric energy harvesting capacity of a material can be calculated given an accurate determination of the temperature dependence of its spontaneous polarization and permittivity. In principle, an Ericsson cycle provides two advantages over the capacitor discharge cycle. The first advantage is that an Ericsson cycle represents a reversible thermodynamic cycle which is a necessary condition for reaching Carnot cycle efficiencies. The second advantage is that the energy harvested by the Ericsson cycle can be increased by increasing the applied electric field. However, the equations in Table 1 suggest that the energy harvested and efficiency could be made arbitrarily high by simply increasing the electric field without limit (at least to the limit where the material suffers catastrophic dielectric breakdown). Ultimately, this is physically impossible since no energy harvesting cycle can exceed the Carnot efficiency. This discrepancy results from the fact that the expressions for Ericsson cycle energy harvesting were derived on the assumption that the permittivity was a function of temperature only.

Figure 6:
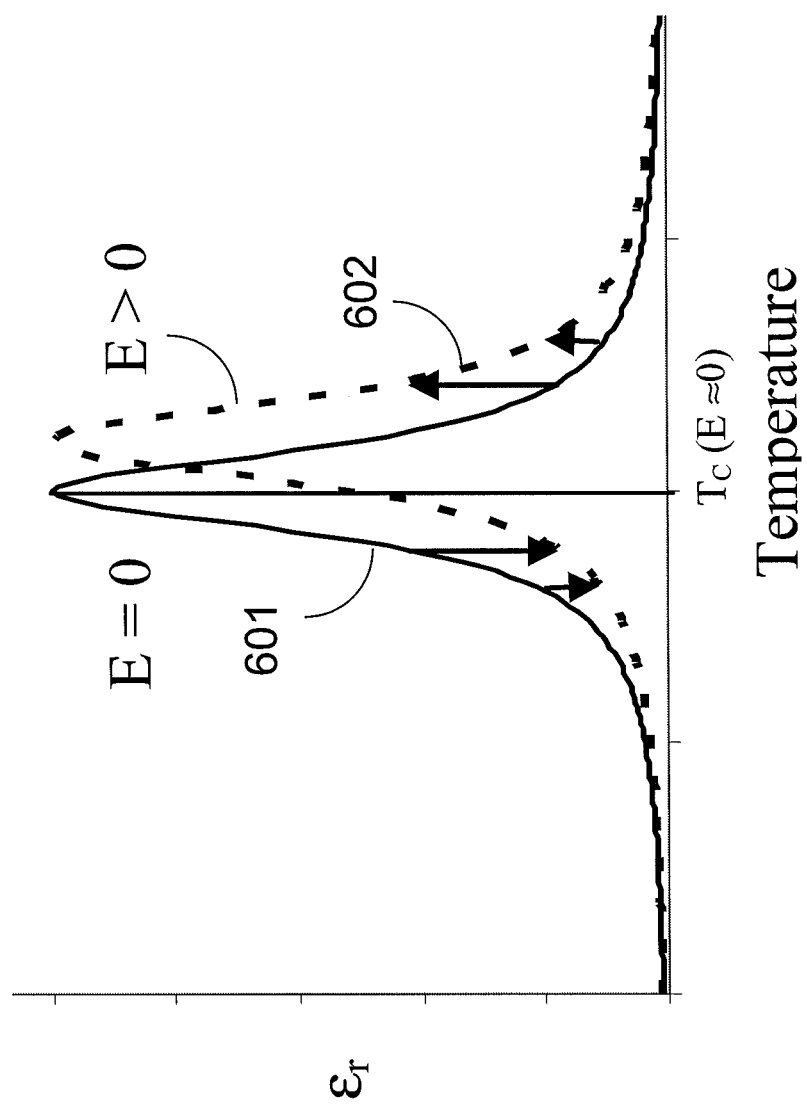
FIG. 6 illustrates shifting of permittivity with applied field, according to some embodiments.

FIG. 6 illustrates shifting of permittivity curves 601 and 602 with applied field, according to some embodiments. It should be noted that the relationship between the polarization and electric field expressed in Equation 11 is only the first term in a power series expansion given by $$P\mathscr{E} = \chi_e^{(1)}\varepsilon_o \mathscr{E} + \chi_e^{(2)}\varepsilon_o \mathscr{E}^2 + \chi_e^{(3)}\varepsilon_o \mathscr{E}^3 + \ldots \quad \text{Eqn. 16}$$

At high applied fields additional terms of the expansion must be included. This ultimately leads to a field dependence of the permittivity. The general effect of higher order terms in the polarization-electric field relationship can be anticipated by the following qualitative physical description: the permittivity peaks near the Curie temperature, which is to say that the material is easily polarized with relatively small electric fields near $T_C$. An alternative description is to say that when an electric field is applied to the material (in the same direction as the spontaneous polarization), the material maintains its spontaneous polarization to a higher temperature. In effect, increasing the Curie temperature or alternatively shifting the permittivity curve up in temperature from curve 601 to curve 602, as in FIG. 6, has the effect of decreasing the permittivity at temperatures below $T_C$ and increasing the permittivity at temperatures above $T_C$ with the magnitude of the change decreasing at T farther from $T_C$. As a result, the isothermal P-E plots for real materials would be more similar to those of FIG. 7.

Figure 7:
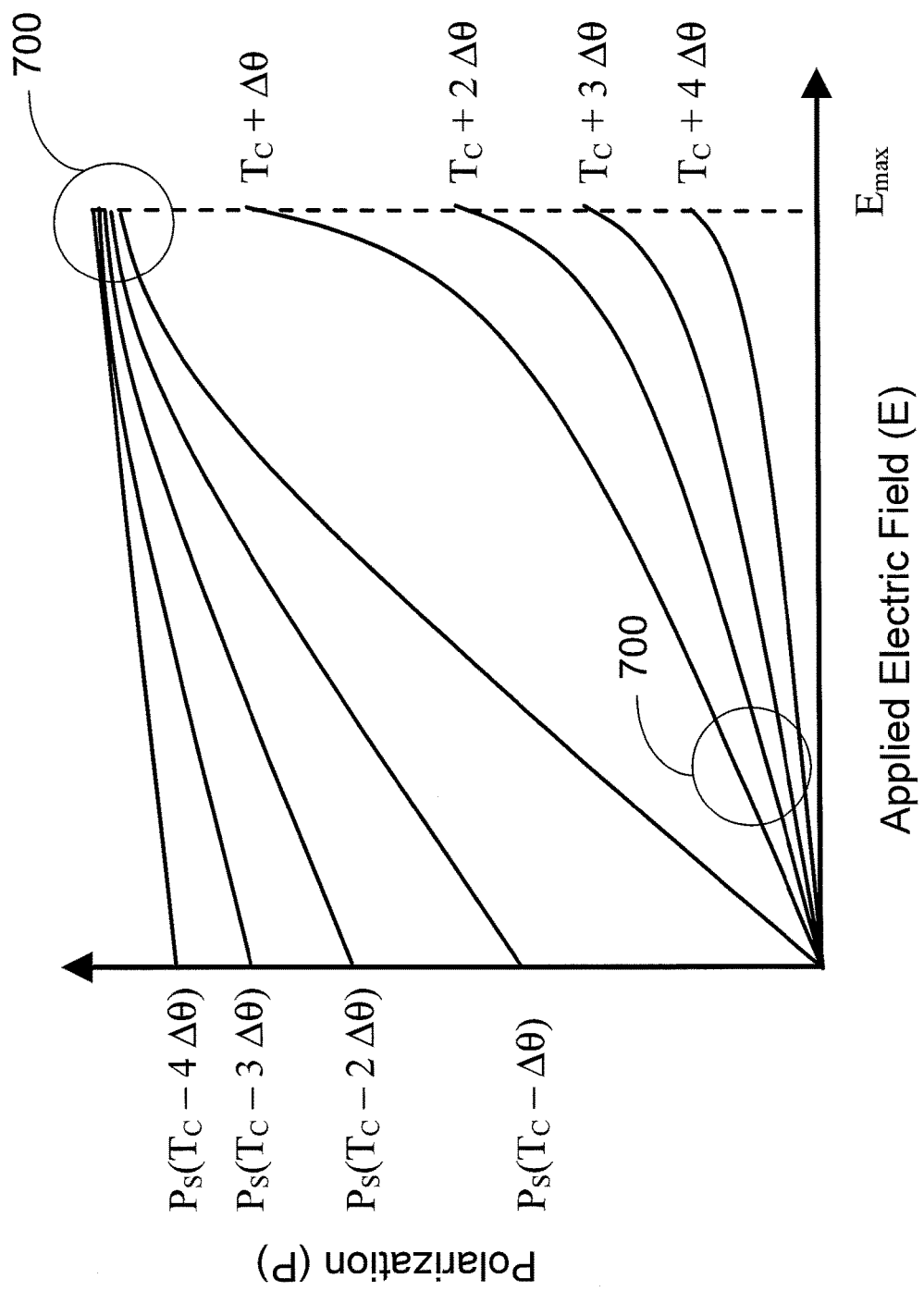
FIG. 7 illustrates bending of P-E curves at high fields, according to some embodiments.

FIG. 7 illustrates bending of P-E isothermal curves 700 at high fields, according to some embodiments. At sufficiently high field values the second term in the expression for Ericsson cycle energy harvesting becomes negative ($\varepsilon' < \varepsilon''$) and ultimately the energy harvested begins to decrease with increasing field. Accurately predicting the Ericsson cycle energy harvesting capacity of a pyroelectric material requires accurate determination of the temperature and field dependence of the permittivity. In the absence of this information, the capacitor discharge method can provide a quick estimation of the minimum energy harvesting capacity to determine the feasibility of any particular pyroelectric material.

Figure 8:
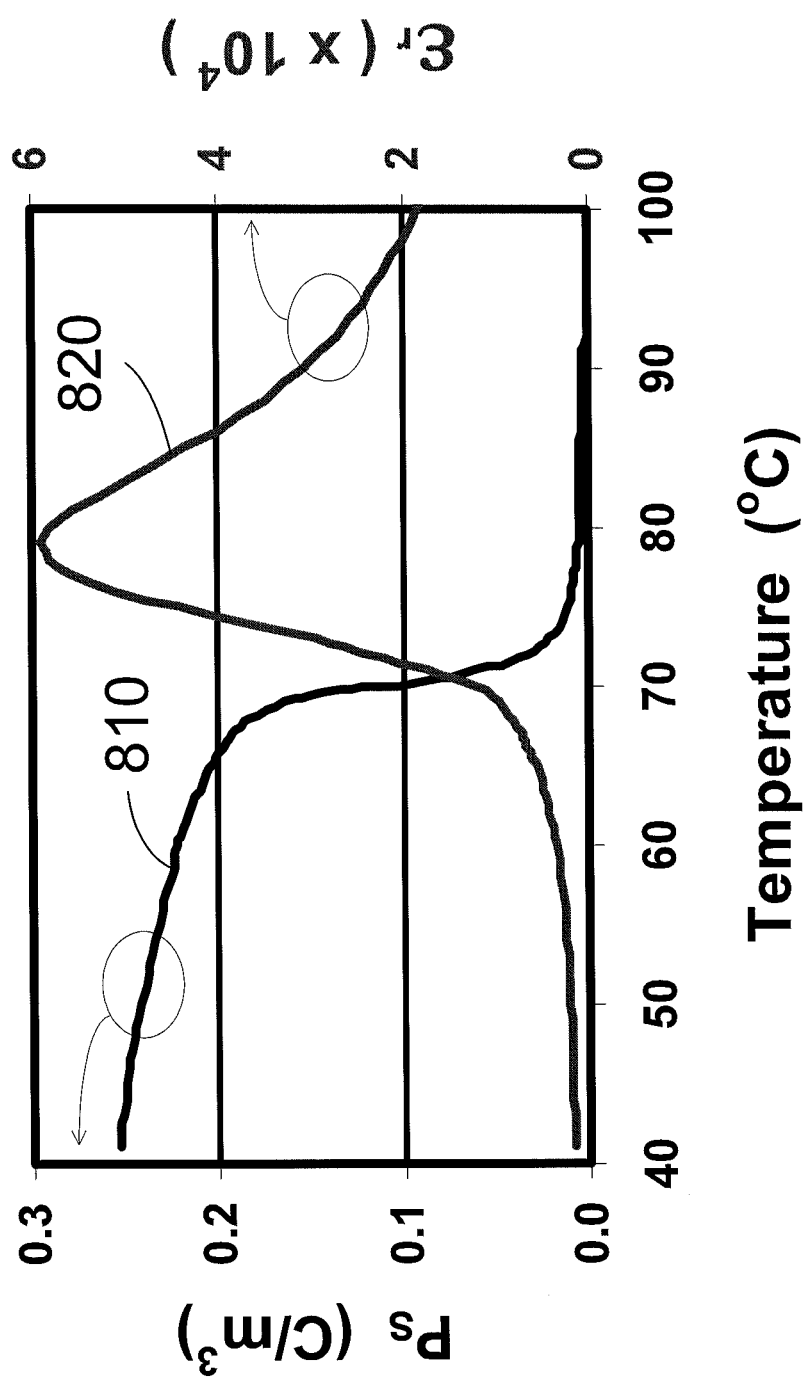
FIG. 8 illustrates temperature dependence of spontaneous polarization and permittivity for SBN61, according to some embodiments.

FIG. 8 illustrates temperature dependence of spontaneous polarization 810 and permittivity 820 for Strontium Barium Niobate 61 ($Sr_{0.61}Ba_{0.39}Nb_2O_6$ or SBN61), according to some embodiments. Strontium barium niobate ($Sr_xBa_{1-x}Nb_2O_6$ or SBN) is a family of single crystal relaxor ferroelectrics with high spontaneous polarization and with Curie temperatures in the range of interest for many waste heat recovery applications. Published data for spontaneous polarization and permittivity as a function of temperature are available for a number of compositions with the most well characterized being the congruently melting composition SBN61 ($Sr_{0.61}Ba_{0.39}Nb_2O_6$). Although there are some variations in the published data depending on the quality of the as-grown crystals and the experimental details of the measurement (method of determination, measurement frequency, temperature cycling rate, etc.), the data in FIG. 8. shows typical measured values (see, e.g., J. Wilde, *Growth and Characterization of Strontium Barium Niobate Crystals for Multiplaex Photorefractive Holography*, Ph.D Dissertaion, Department of applied Physics, Stanford University (1992)). From FIG. 8, it can be seen that the greatest change in spontaneous polarization over the smallest temperature range lies in the 65° C. to 75° C. region. For larger temperature excursions, the change in spontaneous polarization is much smaller for incrementally larger changes in temperature.

Using the values for the spontaneous polarization and permittivity from FIG. 8 and the heat capacity of SBN (2.3 J/(cm$^3$/K)), the energy harvested, thermal efficiency, and relative Carnot efficiency can be calculate using the equations of Table 1. Results for these calculations are presented in FIGS. 9-11 as a function of the cold and hot cycle temperatures.

Figure 9:
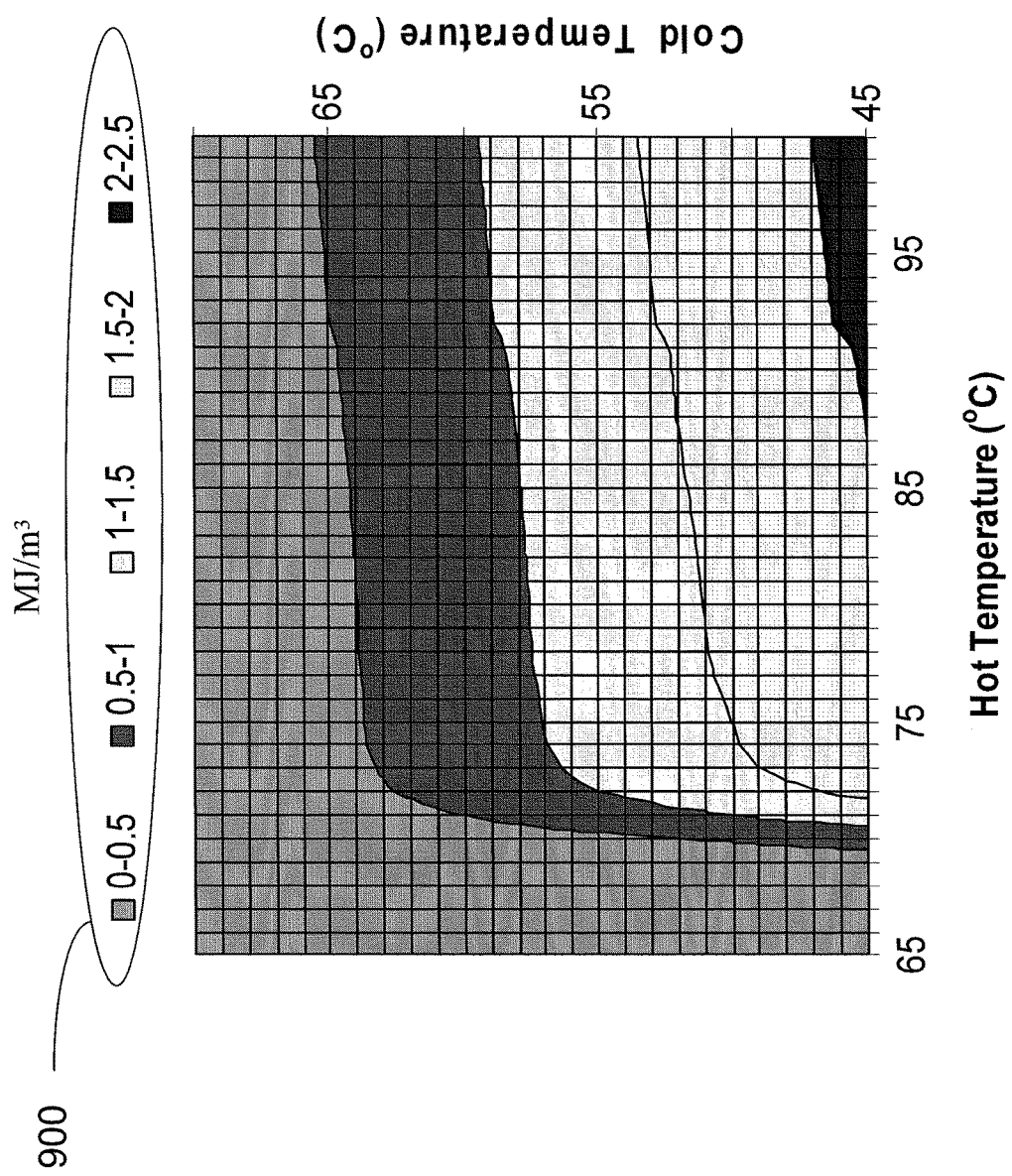
FIG. 9 illustrates energy harvest in MJ/m$^3$ per thermal cycle for SBN61 PEC energy harvester using capacitor discharge, according to some embodiments.

FIG. 9 illustrates energy harvest 900 in MJ/m$^3$ per thermal cycle for a SBN61 PEC energy harvester using capacitor discharge, according to some embodiments.

Figure 10:
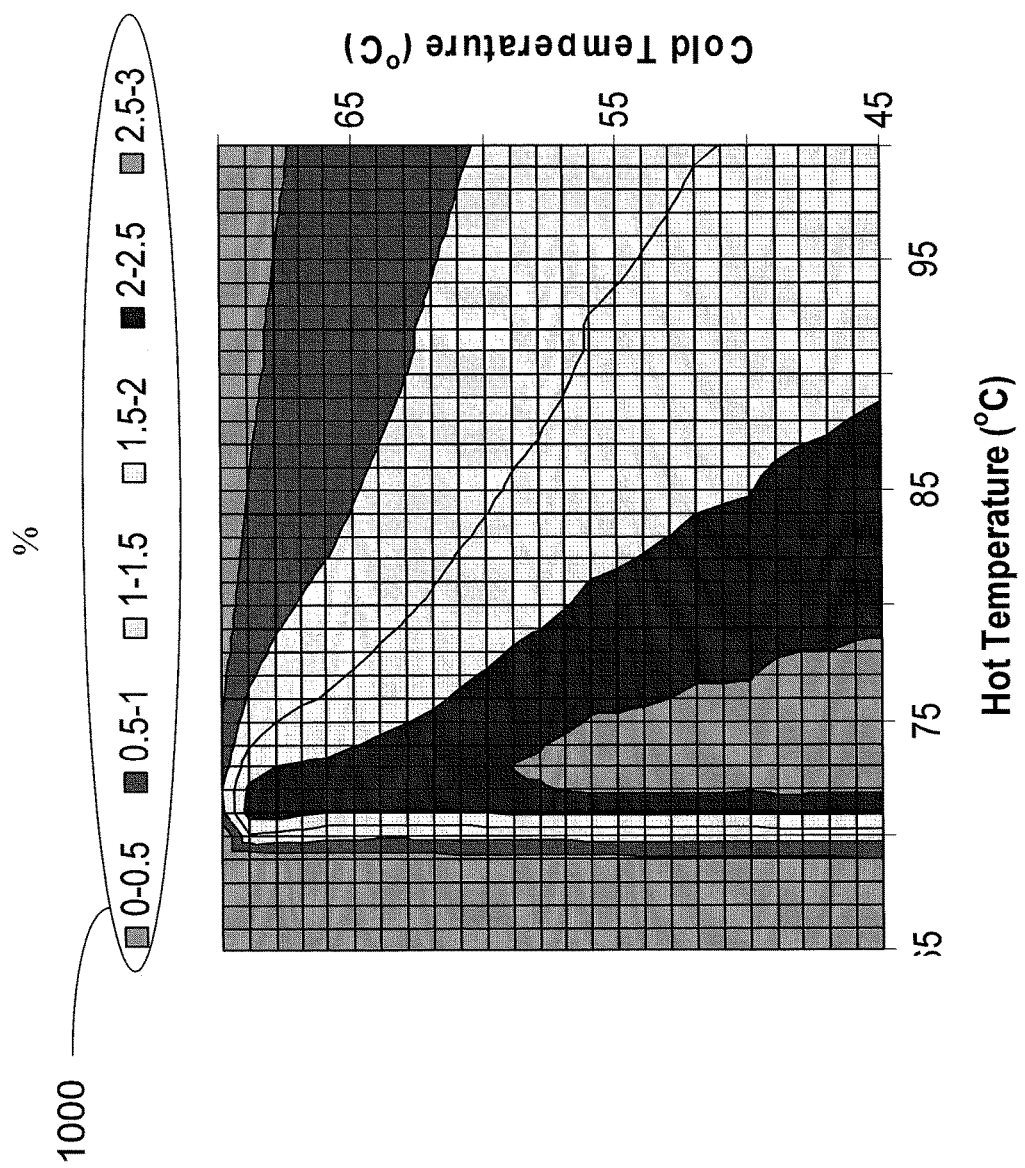
FIG. 10 illustrates thermal efficiency for SBN61 PEC energy harvester using capacitor discharge, according to some embodiments.

FIG. 10 illustrates thermal efficiency 1000 for a SBN61 PEC energy harvester using capacitor discharge, according to some embodiments.

Figure 11:
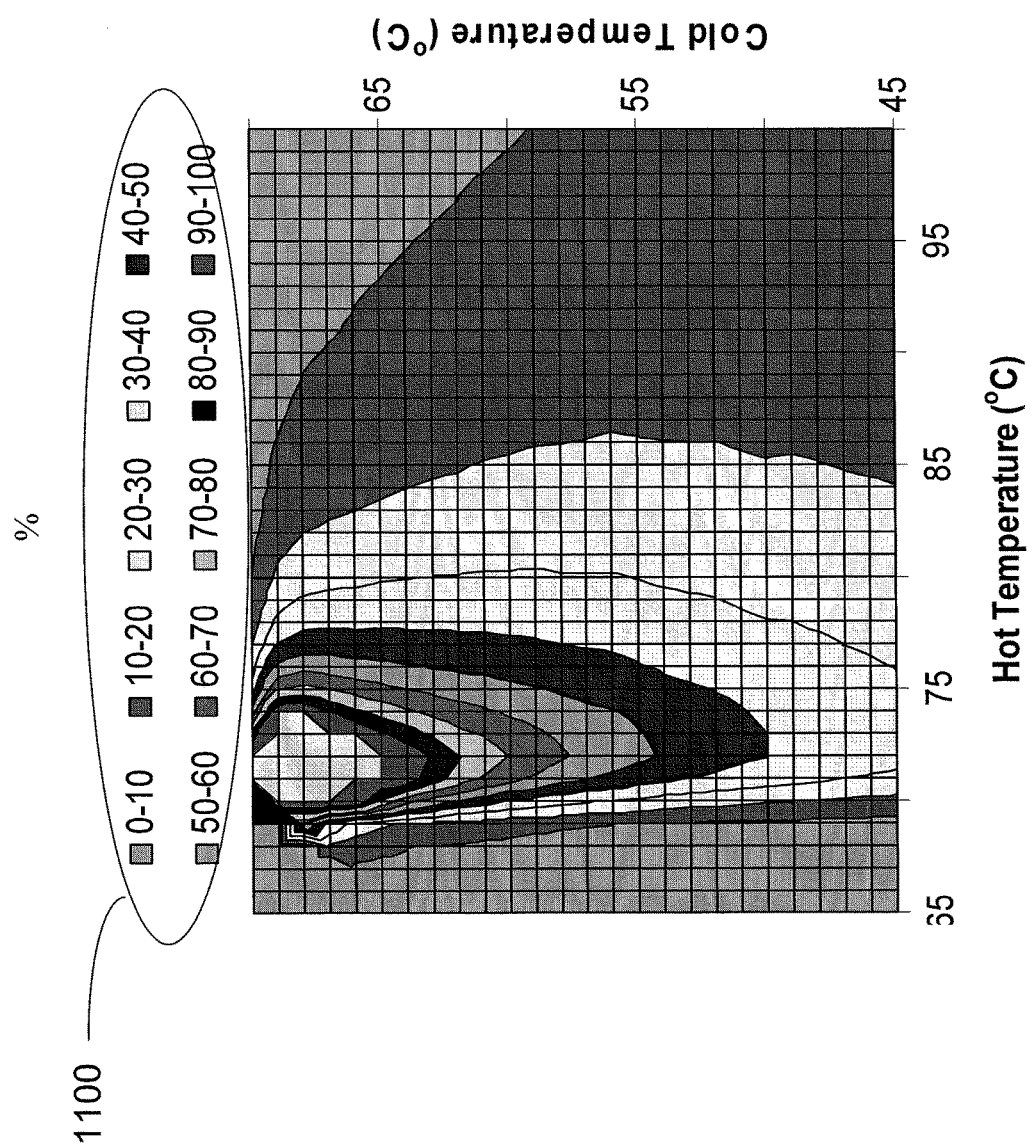
FIG. 11 illustrates percent Carnot efficiency for SBN61 PEC energy harvester using capacitor discharge, according to some embodiments.

FIG. 11 illustrates percent of the Carnot efficiency 1100 ($\eta_{PEC}/\eta_{Carnot}$) for a SBN61 PEC energy harvester using capacitor discharge, according to some embodiments.

From FIG. 11 it can be seen that the energy harvesting capacity can approach the Carnot limit over small temperature differentials around the temperature of the rapid decrease in spontaneous polarization. For cold and hot temperatures of about 62° C. and about 72° C. respectively, the efficiency reaches about 80% of the Carnot efficiency. However, the Carnot efficiency itself is very small due to the small temperature differential (about 10° C.) so that the thermal efficiency is about 2.4%.

In comparison, the efficiency of thermoelectric (TE) energy harvesting can be approximated by the formula $$\frac{\eta}{\eta_{Carnot}} = \frac{\sqrt{1+ZT} - 1}{\sqrt{1+ZT} + \frac{\theta_c}{\theta_h}}$$ Eqn. 17 where ZT is a figure of merit characteristic of the material.

Figure 12:
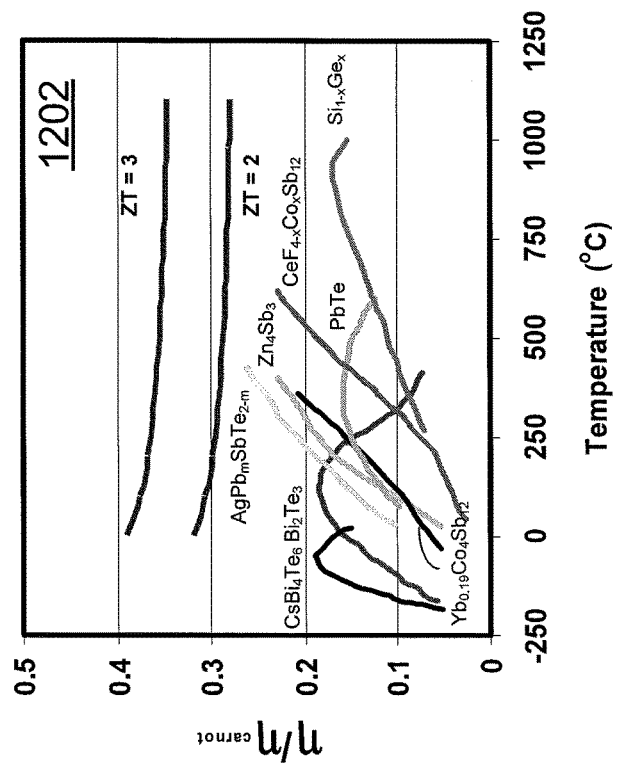
FIG. 12 illustrates figures of merit (ZT) of common thermoelectric materials and conversion efficiency relative to the Carnot efficiency, according to some embodiments.
Figure 12:
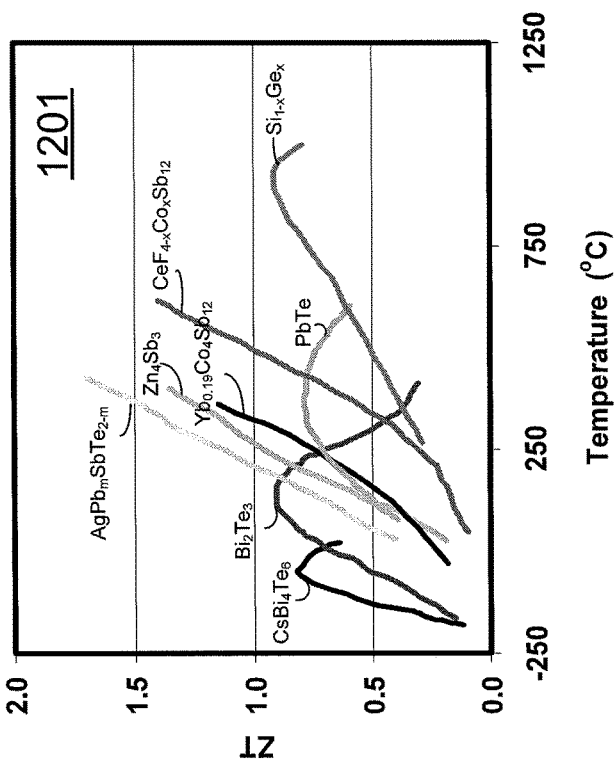

FIG. 12 illustrates ZT values for several common TE materials used for PEC/TDEC elements according to some embodiments. Curves 1201 in FIG. 12 include data from T. M. Tritt, M. A. Subramanian, *Thermoelectric Materials, Phenomena, and Applications: A Bird's Eye View*, MRS Bulletin, 31, 188 (2006). Also shown in FIG. 12 is graph 1202 plotting the calculated efficiency relative to the Carnot efficiency for these materials as well as the efficiency for hypothetical TE materials with ZT figures of merit of 2 and 3 over the entire temperature range. None of the real thermoelectric materials reach efficiencies greater than about 30% of the Carnot efficiency and even the hypothetical materials with ZT=2 and ZT=3 never reach efficiencies greater than about 40% of the Carnot efficiency.

Although the efficiencies relative to the Carnot efficiency for PEC/TDEC can be much higher than thermoelectric materials as demonstrated in FIGS. 11 and 12, the extremely high efficiency of PEC/TDEC relative to the Carnot efficiency only occurs for relatively narrow temperature differentials (near the PEC material's Curie temperature).

Figure 13:
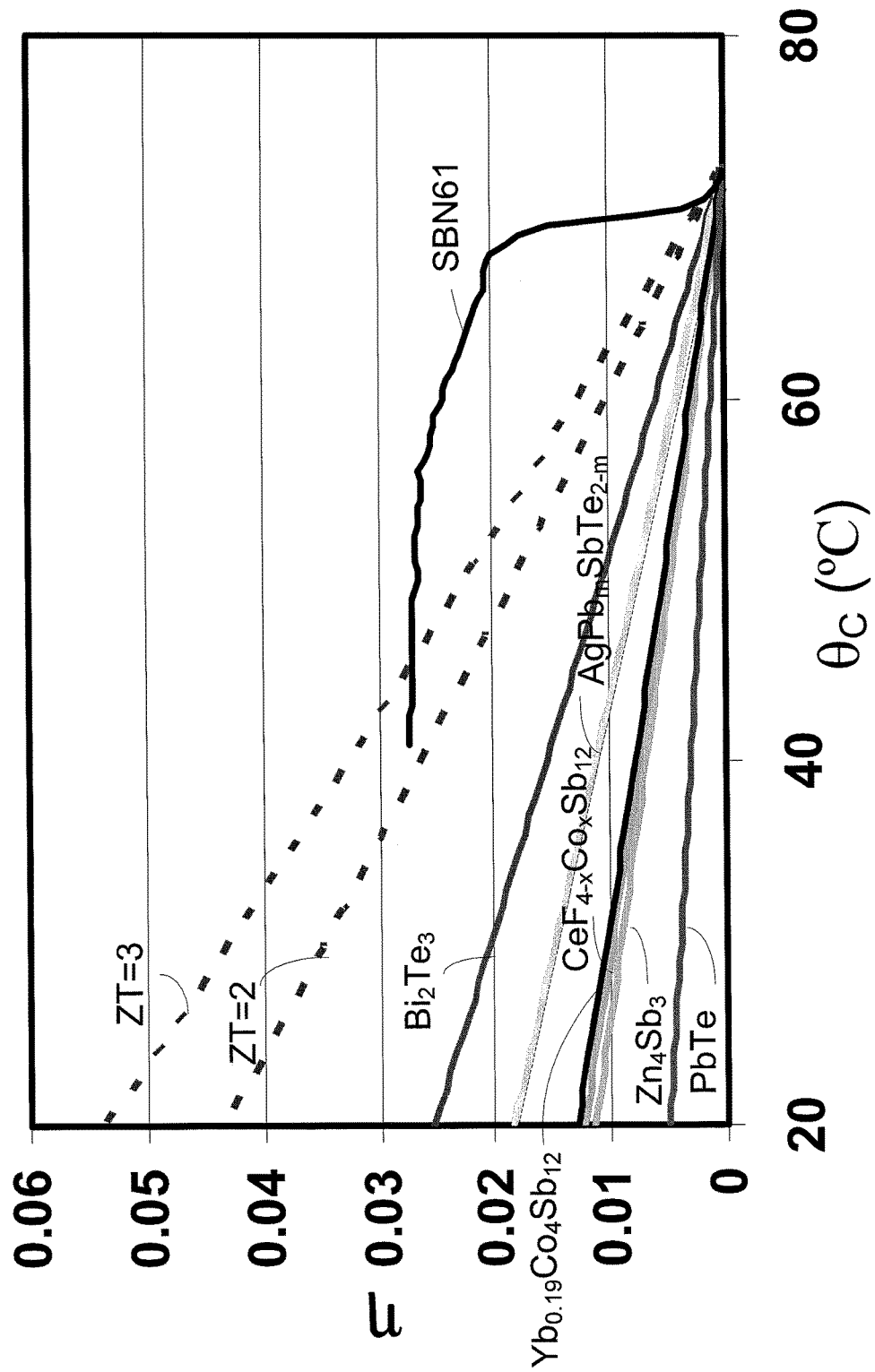
FIG. 13 illustrates thermal efficiency as a function of cold temperature of an SBN61 PEC energy harvester compared to common and hypothetical TE materials with a hot temperature of 72° C., according to some embodiments.

FIG. 13 illustrates thermal efficiency as a function of cold temperature of an SBN61 PEC energy harvester compared to common and hypothetical TE materials with a hot temperature of about 72° C., according to some embodiments. A comparison of the thermal efficiency of PEC using SBN61 and common and hypothetical TE materials is shown in FIG. 13 as a function of cold temperature ($\theta_C$) for a given hot temperature of about 72° C. For cold temperatures below approximately 40° C. (temperature differential of 32° C.), the hypothetical TE materials with ZT=2 and ZT=3 have a higher thermal efficiency than PEC harvesting via SBN61 and for much colder temperatures (<20° C.) the efficiency of common Bi$_2$Te$_3$ TE energy harvesting begins to exceed that of SBN61 energy harvesting.

From the discussion above it can be seen that SBN61 can be used for extremely efficient (>80% relative to the Carnot Efficiency) PEC/TDEC energy harvesting in a narrow temperature range (<10° C.) near its Curie temperature. Similarly high efficiencies can be realized at other temperatures if materials with different Curie temperatures were identified that had similar spontaneous polarization and permittivity behavior near their Curie temperatures. Fortunately, SBN crystals can be grown with varying ratios of Sr and Ba that result in varying Curie temperatures. The Curie temperatures, room temperature pyroelectric coefficients, and room temperature electric permittivity of several SBN compositions are listed in Table 2. It should be noted that the high pyroelectric coefficients and high permittivity for SBN compositions with lower Curie temperatures are a result of the Curie temperature being closer to the measurement temperature (room temperature) and do not represent higher harvestable spontaneous polarization. These data points indicate that other SBN compositions are good candidates for similarly high energy harvesting capacity but to accurately predict their performance in PEC applications a full characterization of the spontaneous polarization and permittivity near the Curie temperature is required.

Figure 14:
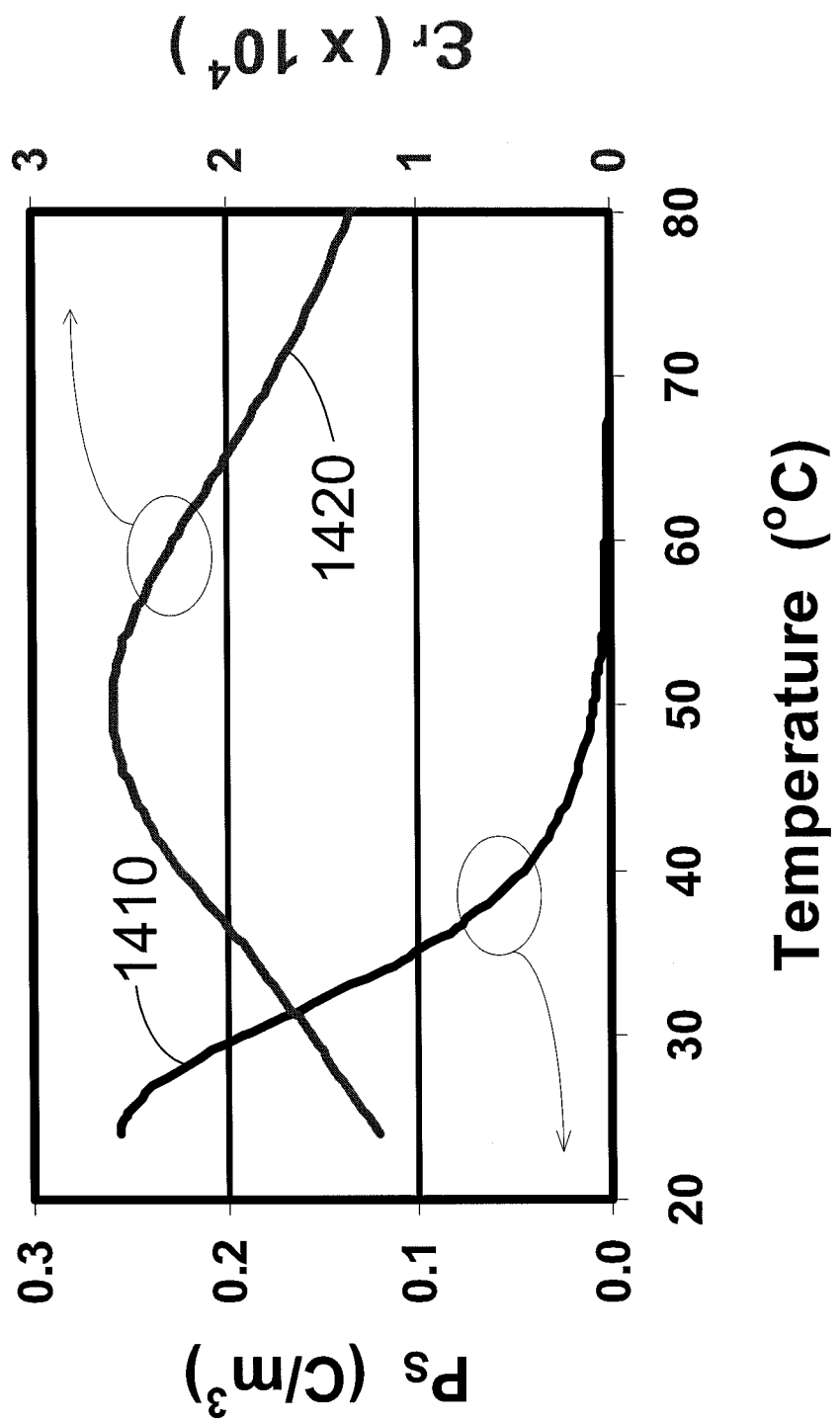
FIG. 14 illustrates temperature dependence of spontaneous polarization and permittivity for SBN75, according to some embodiments.

FIG. 14 illustrates temperature dependence of spontaneous polarization 1310 and permittivity 1320 for SBN75, according to some embodiments. The data for SBN75 is shown in FIG. 14 and the shift in $T_C$ to lower temperatures compared to SBN61 (FIG. 8) is easily noted. The spontaneous polarization drop is the same magnitude but over a slightly larger temperature range than FIG. 8 and the permittivity is of the same magnitude but peaks less sharply. While detailed characterization similar to that shown in FIG. 8 and FIG. 14 are not generally available for other SBN compositions, the similarity in the data in SBN61 and SBN75 suggests that the other SBN compositions should be expected to perform similar to SBN61.

TABLE 2

Sr$_x$Ba$_{1-x}$Nb$_2$O$_6$ Curie temperatures, pyroelectric coeff, permittivities measured at room temperature.

| X | $T_C$ (° C.) | p ($\mu$C m$^{-2}$ K$^{-1}$) | $\epsilon/\epsilon_0$ |
|---|---|---|---|
| 0.25 | 196 | 300 | 180 |
| 0.49 | 119 | 600 | 400 |
| 0.60 | 80 | 850 | 610 |
| 0.67 | 67 | 1100 | 1800 |
| 0.73 | 57 | 28000 | 8200 |

Given a series of SBN crystals with sequential Curie temperatures, a cascaded PEC energy harvester can be envisioned.

Figure 15A:
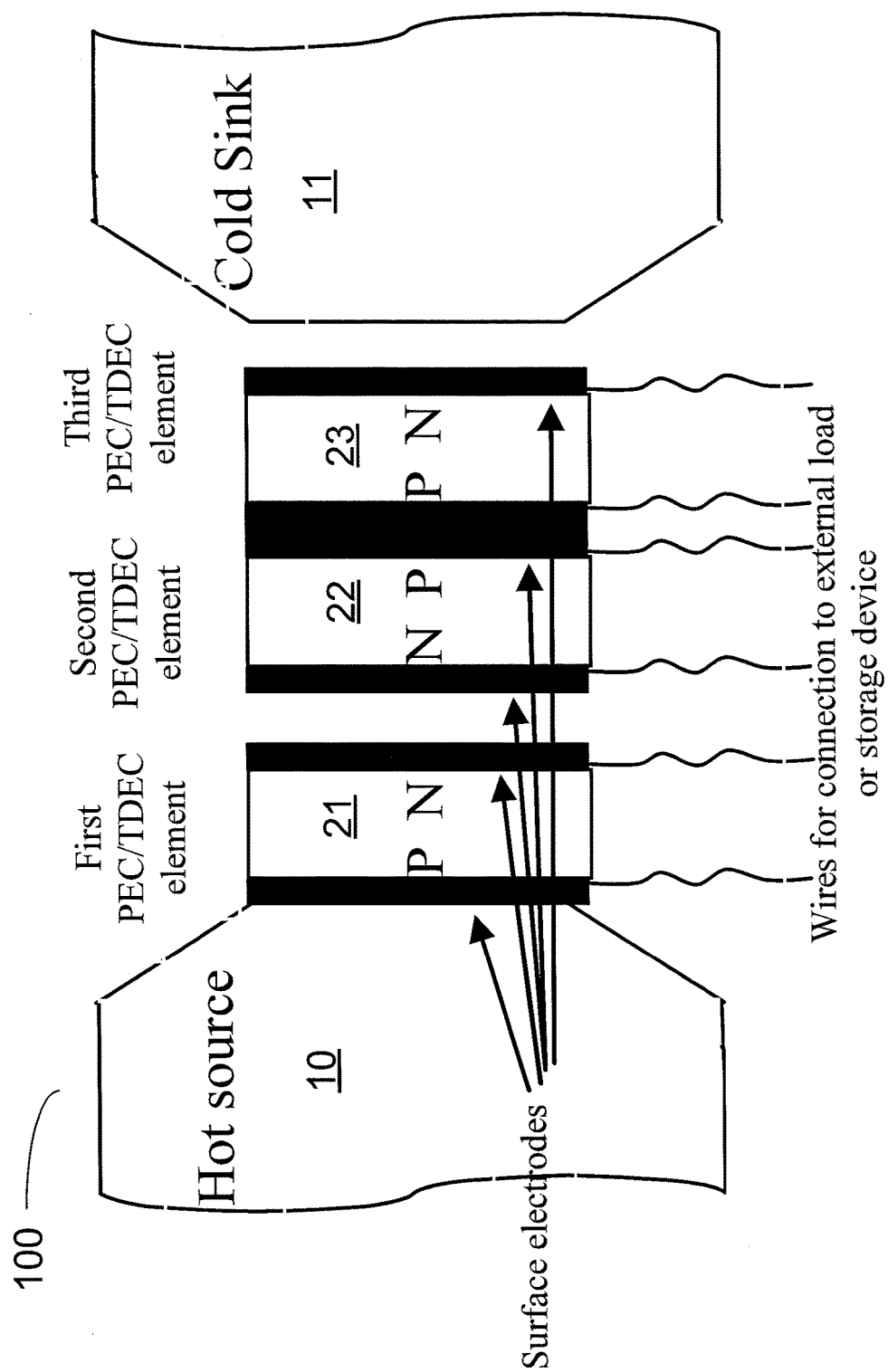

FIGS. 15A-E show a simple three stage cascaded energy converter 100 based on the capacitive discharge model previously described. In FIG. 15A, all elements have reached thermal equilibrium and all free charge generated in the previous cycle step have been harvested and all electrical connections are open. The first pyroelectric element 21 is in thermal equilibrium with the hot source 10 at a temperature $\theta_H$ that is hotter than the Curie temperature of the first pyroelectric element. The second (22) and third (23) PEC/TDEC elements are in thermal equilibrium with each other at a temperature that is cooler than the Curie temperature of the second PEC/TDEC element and hotter than the Curie temperature of the third PEC/TDEC element. The cold sink 11 is thermally isolated from the PEC/TDEC elements at a temperature $\theta_C$ that is cooler than the Curie temperature of the third PEC/TDEC element. PEC/TDEC element 21 is then physically moved so as to become thermally isolated from the hot source 10 and brought into thermal contact with PEC/TDE element 22 as in FIG. 15B. Simultaneously, PEC/TDEC element 23 is moved so as to become thermally isolated from PEC/TDEC element 22 and brought into thermal contact with the cold sink 11. When the system has reached thermal equilibrium, the first and second PEC/TDEC elements 21, and 22, will be stable at a temperature that is colder than the Curie temperature of the first element and hotter than the Curie temperature of the second element. Cooling of PEC/TDEC element 21 through its Curie temperature will bind positive charge on the P electrode leaving an equivalent negative charge on the P electrode free to move through a circuit. Similarly, negative charge is bound on the N electrode leaving an equivalent positive charge on the N electrode free to move through a circuit. Since PEC/TDEC element 22 is simultaneously heated through its Curie temperature, previously bound positive charge on the P electrode and bound negative charge on the N electrode are no longer bound and are now free to move through a circuit. PEC/TDEC element 23 is cooled through its Curie temperature during the process and in the same manner as the first PEC/TDEC element, negative charge on the P electrode and positive charge on the N electrode are free to move through a circuit. By closing switches to complete the circuit as in FIG. 15C, positive current flows from the N electrode of PEC/TDEC element 23 to the P electrode of the first pyroelectric element 21 until all the free charge is drained from the PEC/TDEC elements. After all free charge has moved through the circuit, all electrical switches are opened and the first (21) and third (23) elements are moved to return to their original positions (first element in contact with the hot source and third element in contact with the second element) as in FIG. 15D.

The first element (21) is heated until it comes to thermal equilibrium with the hot source while the second element is cooled and third element (23) heated until they come into thermal equilibrium with each other. Free charges collect on the surface in a manner similar to the previous analysis with the sign of the charges reversed from the first half of the cycle. Closing the appropriate switches as in FIG. 15E to complete the electrical circuit allows positive current to flow from the P electrode of PEC/TDEC element 21 to the N electrode of the third element (23) (opposite direction compared to the first half-cycle). If the energy harvester is connected to a direct current device or storage device, the polarity of the connected device must be reversed via appropriate electrical switching. After all free charge has moved through the circuit, all electrical switches are opened returning the device to its original configuration (FIG. 15A) and the entire cycle can be repeated.

Although a single circuit is shown in FIG. 15C and FIG. 15E, each PEC/TDEC element can be individually connected to an external load or storage device 40 to harvest energy independently for each element. Although FIGS. 15A-E show a cascaded energy harvesting device with three PEC/TDEC elements, the cascade can be increased to any number of elements required to span the entire temperature range from the cold sink temperature to the hot source temperature with the temperature range of each individual element determined by details of the temperature dependence of spontaneous polarization and permittivity of that element.

In FIGS. 15A-E, heat is transferred from one element of the device to another via physical movement of the appropriate elements to establish thermal contact or isolation via conduction. Thermal contact or isolation can also be accomplished by insertion of additional elements which allow for the thermal conductivity to be turned "on" or "off" between elements.

Figure 16A:
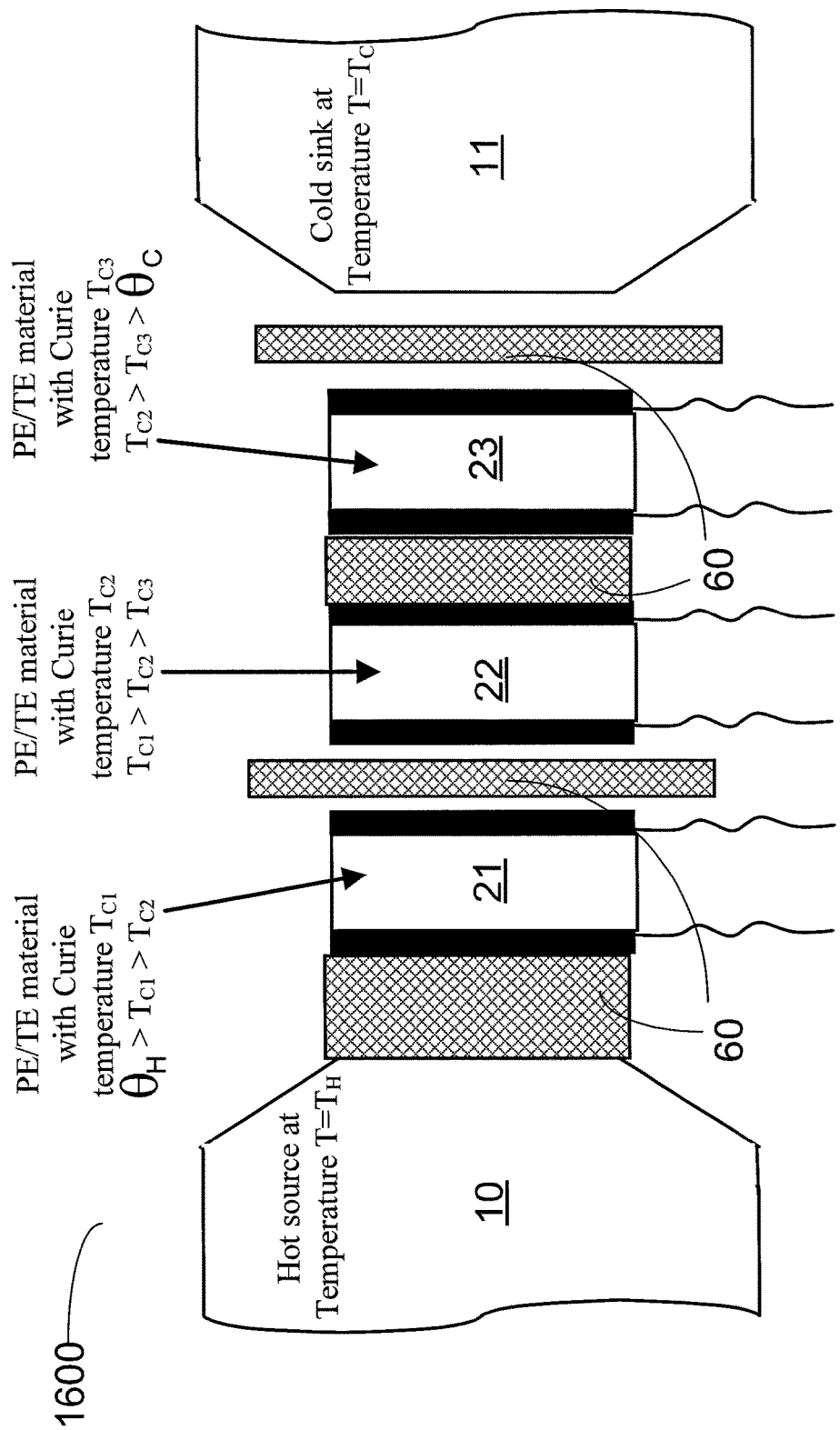
FIGS. 16A-B illustrate an example of thermal cycling and energy harvesting in a cascaded PEC/TDEC energy harvester, according to some embodiments.
Figure 16B:
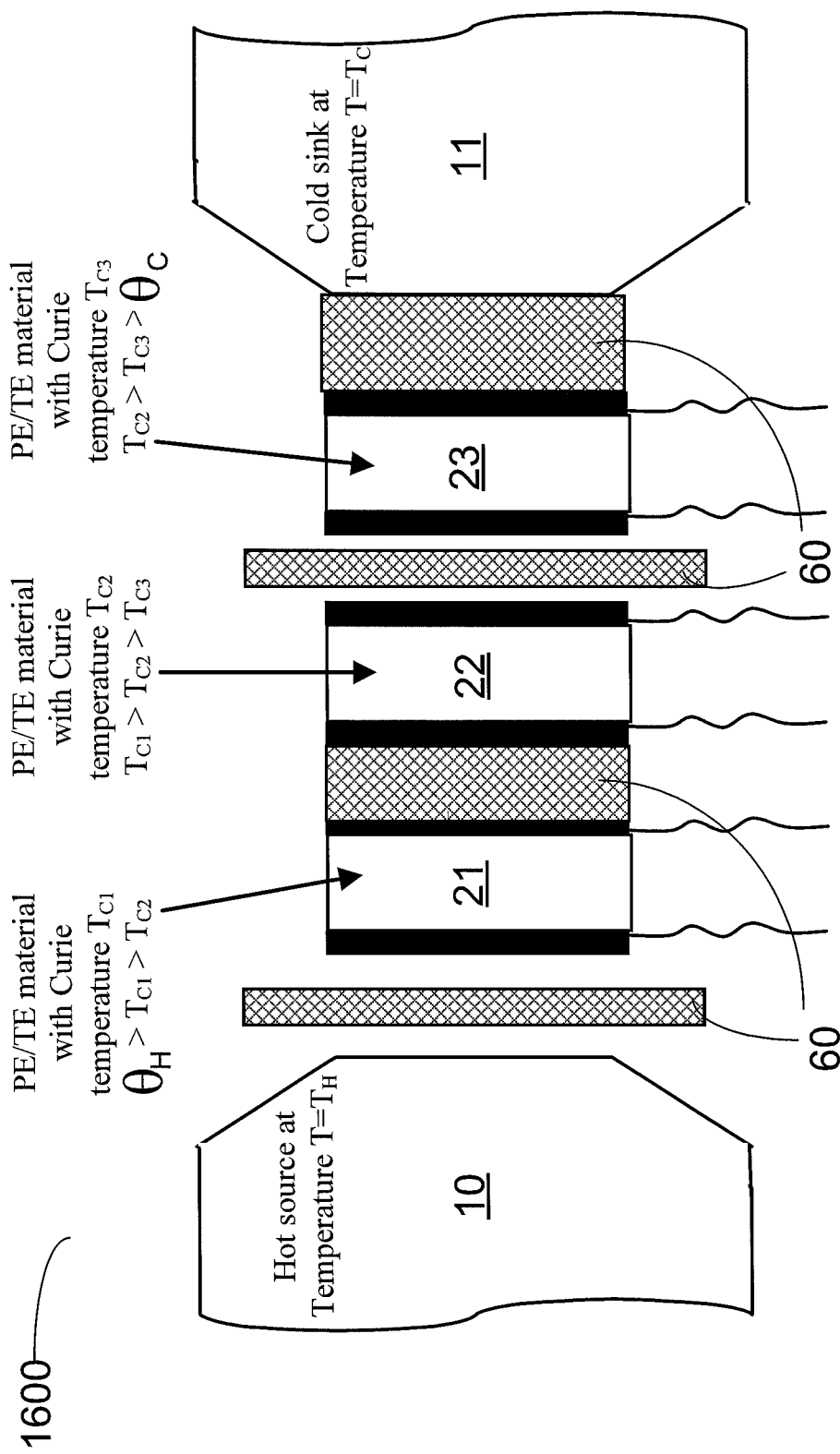

FIGS. 16A-B illustrate an example of thermal cycling and energy harvesting in a cascaded PEC/TDEC energy harvester 1600, according to some embodiments. One example of such a device is shown in FIGS. 16A-B. A gap thermal conductor 60 is inserted between each of PEC/TDEC elements 21-23, between the PEC/TDEC element 21 and hot source 10, and between PEC/TDEC element 23 and cold sink 11. When the gap thermal conductor is expanded horizontally it makes contact with two neighboring PEC/TDEC elements. When the gap thermal conductor is expanded vertically it looses contact with the two neighboring PEC/TDEC elements. Accordingly, FIG. 16A would allow for heating of the first and third PEC/TDEC elements and cooling of the second PEC/TDEC element. Alternatively, FIG. 16B would allow cooling of the first and third PEC/TDEC elements and heating of the second PEC/TDEC elements.

Figure 17A:
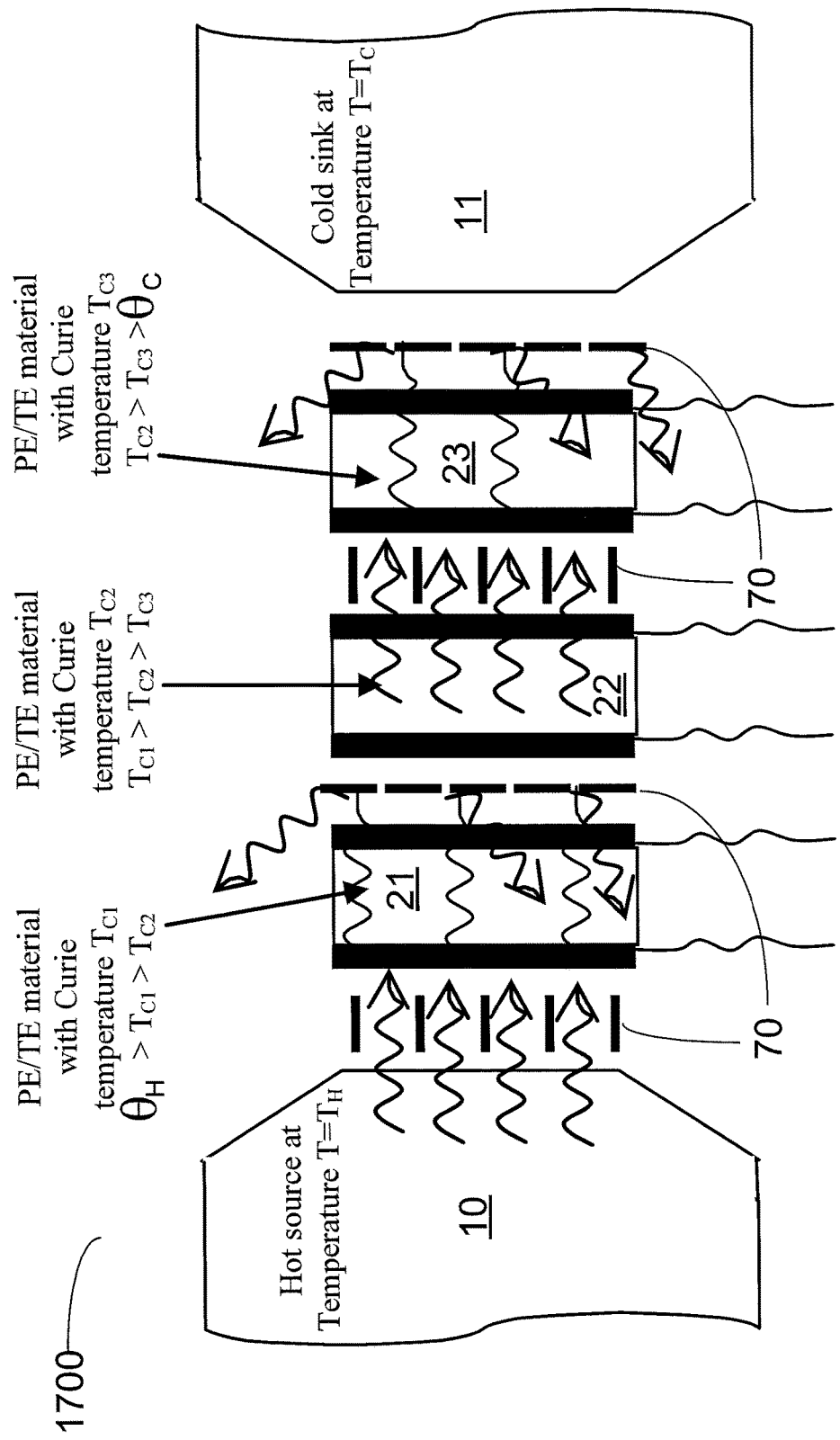
FIGS. 17A-B illustrate an example of thermal cycling and energy harvesting in a cascaded PEC/TDEC energy harvester, according to some embodiments.
Figure 17B:
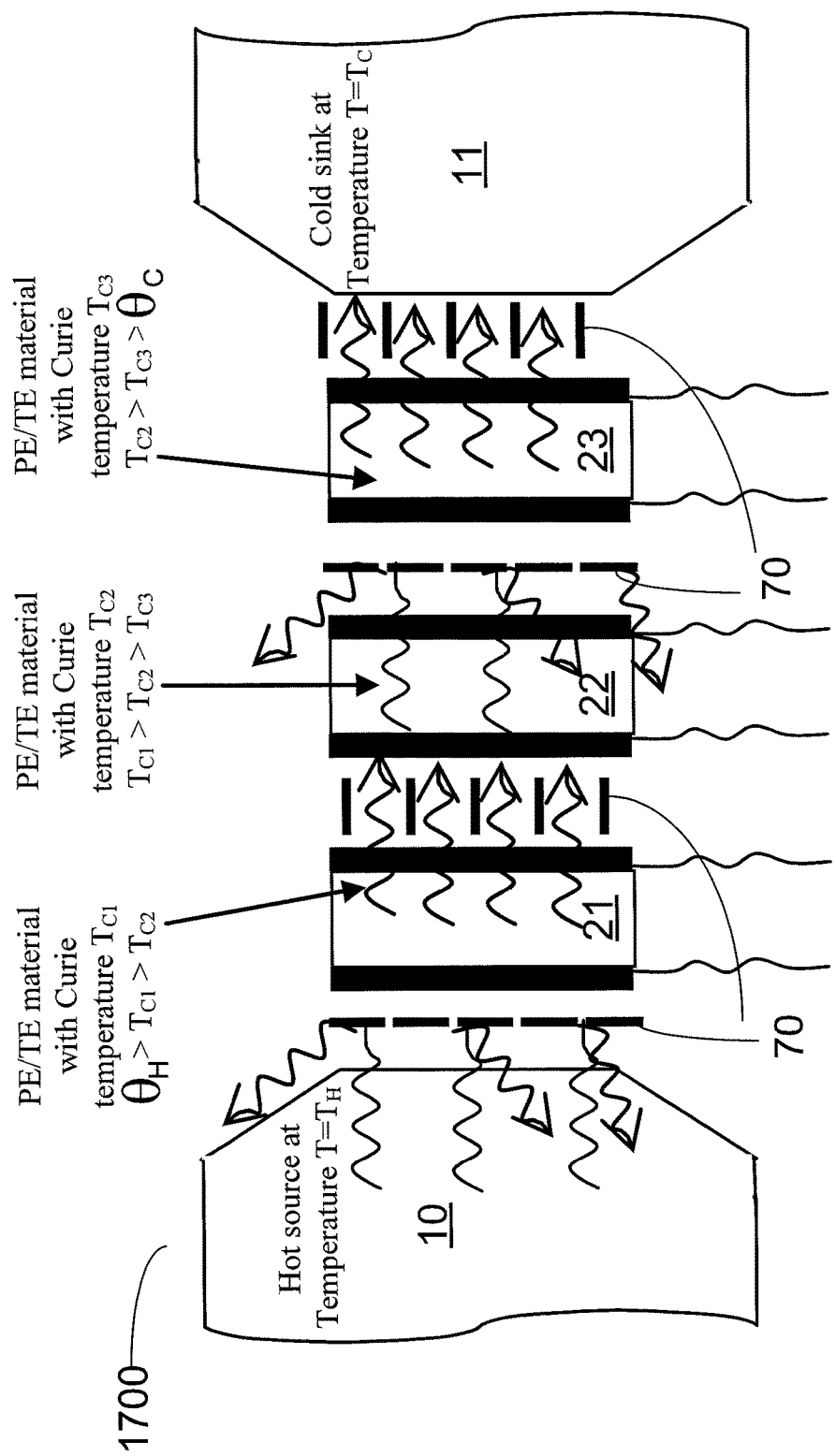

FIGS. 17A-B illustrate an example of thermal cycling and energy harvesting in a cascaded PEC/TDEC energy harvester 1700, according to some embodiments. Although the cascaded device 1700 in FIGS. 15A-E and 16A-B employs thermal conduction to cycle the temperature of the various elements, radiative heat transfer can also be modulated to allow for selective heating and cooling. By placing a variable reflectivity element 70 between the PEC/TDEC elements, radiative heat can be selectively be blocked or transmitted as in FIGS. 17A-B. Accordingly, FIG. 17A would allow for radiative heating of the first and third PEC/TDEC elements and radiative cooling of the second PEC/TDEC element. Alternatively, FIG. 17B would allow radiative cooling of the first and third PEC/TDEC elements and radiative heating of the second PEC/TDEC elements.

Figure 18A:
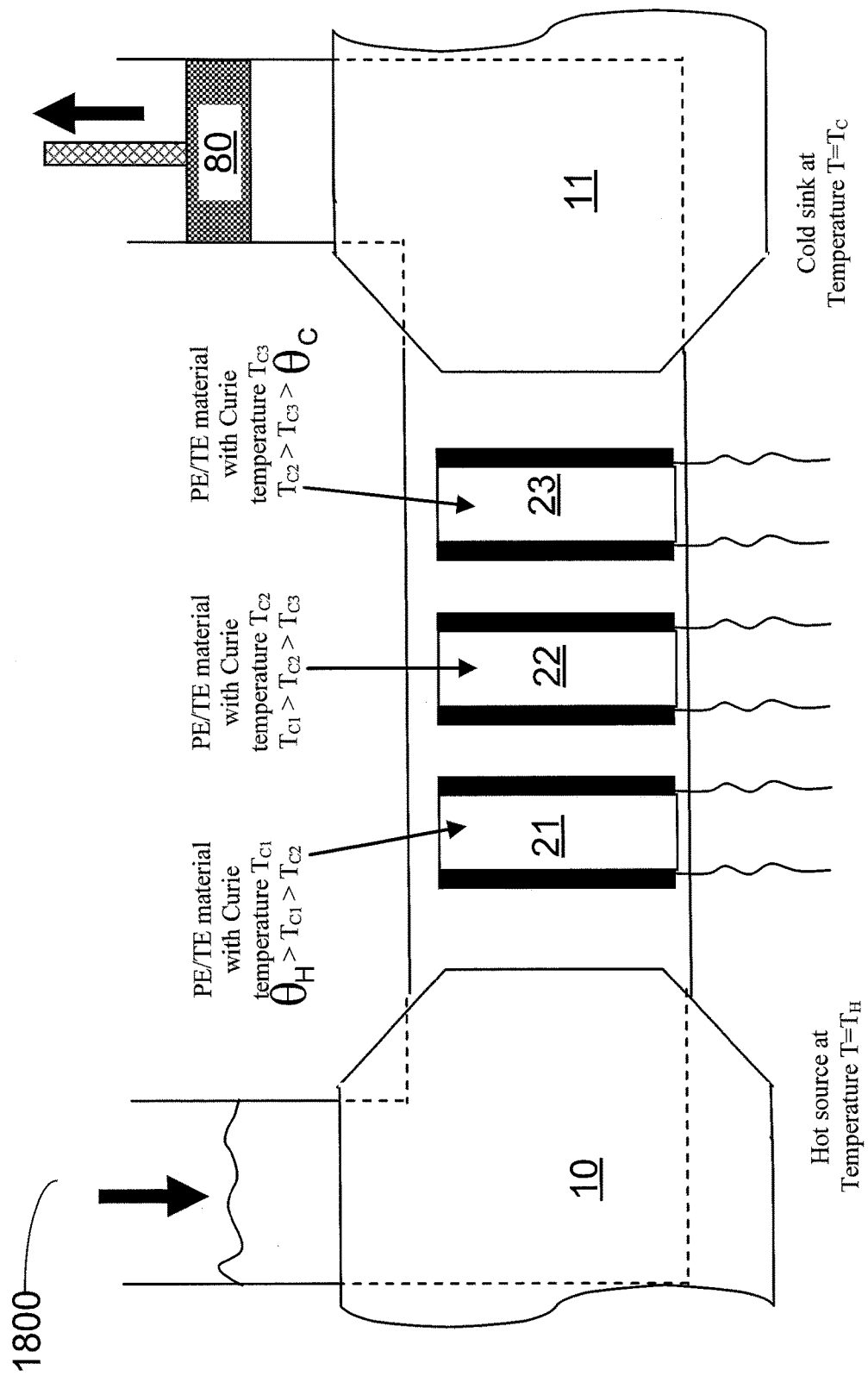
FIGS. 18A-B illustrate an example of thermal cycling and energy harvesting in a cascaded PEC/TDEC energy harvester, according to some embodiments.
Figure 18B:
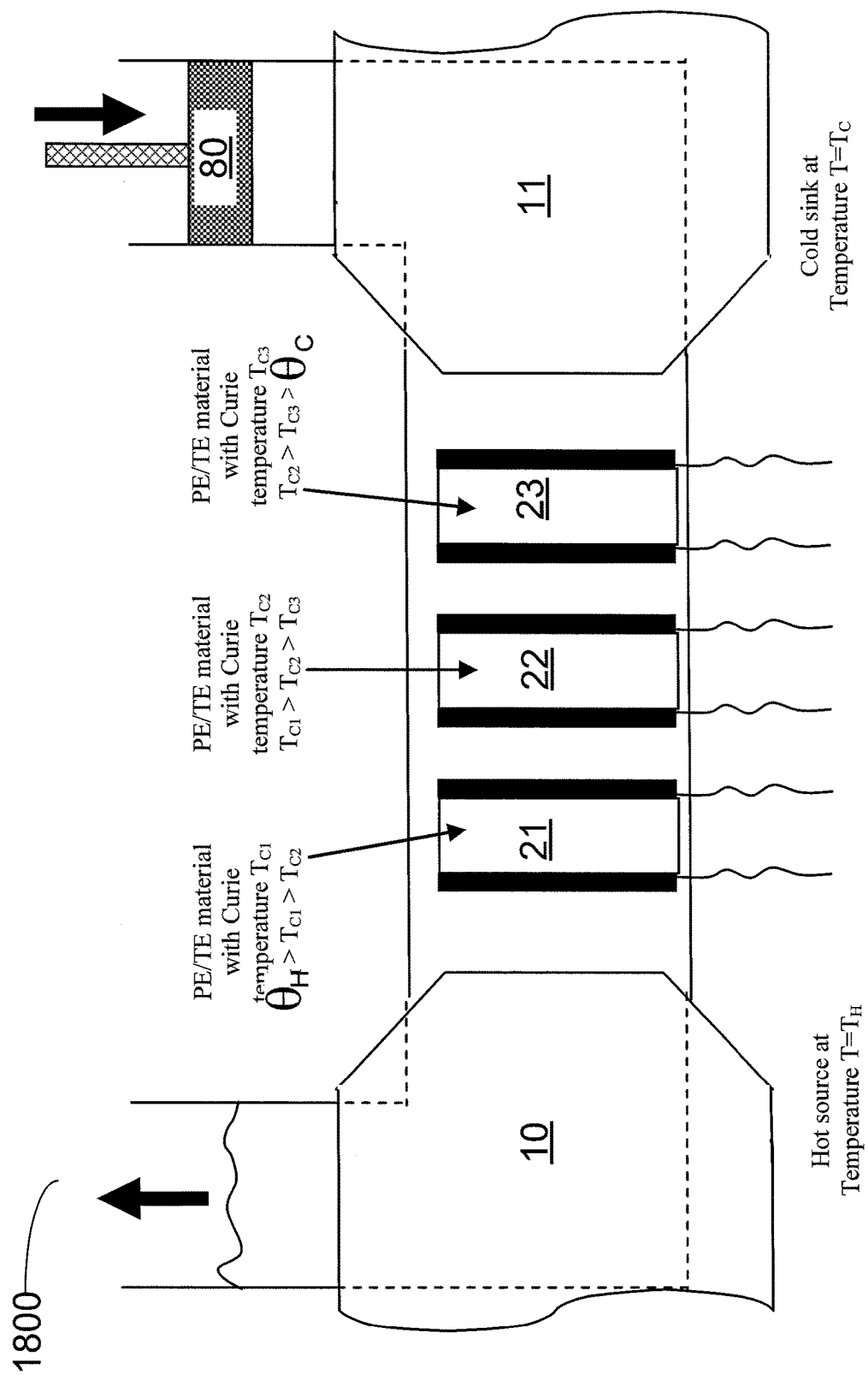

FIGS. 18A-B illustrate an example of thermal cycling and energy harvesting in a cascaded PEC/TDEC energy harvester 1800, according to some embodiments. Convection can also be employed to thermally cycle the PEC/TDEC elements. Placing the PEC/TDEC elements 21-23 in a fluid which connects the hot source 10 and cold sink 11 allows for simultaneous heating and cooling all of the elements. The fluid has a spatial temperature gradient which can be modulated back and forth via a piston 80 as in FIGS. 18A-B. In FIG. 18A the piston 80 is moved up drawing hotter fluid across all of the PEC/TDEC elements simultaneously heating each element. Conversely, as the piston 80 is moved down, cooler fluid moves across all of the elements simultaneously cooling each element. Note that the polarity of the second element 22 may be reversed when connected to the working load or electrical storage device as compared to the conductive and radiative thermal cycles of FIGS. 16A-B and 17A-B.

Although the devices in FIGS. 15A-E, 16A-B, 17A-B, and 18A-B are generally presented using the capacitive discharge model previously described, all of the thermal cycling techniques can be extrapolated to Ericsson cycle energy harvesting with the addition of a high voltage source in the circuit to maximize the thermodielectric effect in the harvesting cycle. Although this disclosure has specifically described capacitive discharge and Ericsson cycle energy harvesting, the principles describe and detailed can be employed by anyone skilled in the art to convert thermal energy to electrical energy using the pyroelectric effect and thermodielectric effect using other thermal/electrical cycles.

By employing various SBN compositions as the PEC/TDEC elements in the multi-staged cascaded energy harvester, thermal energy can be efficiently converted to electrical energy using a hot source near 200° C. and a cold sink near 50° C. For example, an SBN23 PEC element ($T_C \approx 200°$ C.) initially at a temperature of about 190° C. would be thermally connected to the hot source at about 200° C. After reaching about 200° C., the pyroelectric charge would be harvested either to a storage device (battery or storage capacitor) or to an active circuit. It would then be thermally isolated from the hot source and thermally connected to the next PEC element (SBN26, $T_C \approx 190°$ C.) with an initial temperature of 180° C. The temperatures of the two PEC elements would equilibrate at nearly 190° C. and the pyroelectric charge of each element would again be harvested. The two PEC elements would be thermally isolated from each other and the SBN23 element would again be connected to the hot source while the SBN26 element would be connected to the next PEC element in the series (SBN29.5, $T_C \approx 180°$ C.) at a temperature of approximately 170° C. This "bucket brigade" would be continued through a series of elements with sequentially lower Curie temperatures down to the last element (SBN75, $T_C \approx 57°$ C.) which would ultimately dump the remaining heat to the ambient environment. Assuming that each element has a temperature dependence of spontaneous polarization and permittivity near $T_C$ similar to that of SBN61, then the energy could be harvested from approximately 200° C. to 50° C. through a fifteen stage converter with an efficiency of approximately 80% of the Carnot efficiency. This would equate to a thermal efficiency of 25%. A similar analysis can be performed for fewer stages with larger temperature differentials which would reduce the number of PEC elements and reduce the complexity at the expense of lower overall conversion efficiency. The net thermal efficiencies for various SBN multistage energy harvesters is given in Table 2 and are compared with common (ZT≈1) and hypothetical (ZT=2 and 3) TE materials operating in the same overall temperature range (about 200° C. to about 50° C.). With only 5 stages of approximately 30° C., the SBN PEC energy harvester is still more efficient than a single stage TE energy harvester using realistic ZT values near one. In addition, maintaining approximately 150° C. temperature gradient across the TE elements is a non-trivial task.

TABLE 3

Comparison of various PEC and TE energy harvesters operating between $\theta_H = 200°$ C. and $\theta_C = 50°$ C.

| Process | Number of Stages | ΔT/stage | $\eta/\eta_{carnot}$ | η (thermal) |
|---|---|---|---|---|
| PEC (SBN) | 15 | 10 | 80% | 26% |
| PEC (SBN) | 10 | 15 | 58% | 19% |
| PEC (SBN) | 5 | 30 | 32% | 10% |
| TE (ZT = 1) | 1 | 150 | 25% | 8% |
| TE (ZT = 2) | 1 | 150 | 37% | 12% |
| TE (ZT = 3) | 1 | 150 | 44% | 14% |

The most significant thermodynamic difference in PEC and TE energy harvesting is that PEC conversion involves equilibrium state variables of the pyroelectric material and thus one can in principle construct reversible thermodynamic cycles with Carnot efficiencies. In contrast, TE energy harvesting relies on temperature gradients in the material which is inherently a non-equilibrium state. As such reversible thermodynamic cycles can not be constructed using TE energy harvesting and efficiencies by definition can not reach Carnot efficiencies. Operationally, the most significant difference in PEC and TE energy harvesting is that TE devices require a spatial temperature gradient while PEC devices require a temporal temperature gradient. As a result, additional elements must be added to the PEC harvester to cycle the temperature of each element in the thermal "bucket brigade". While some thermal switching techniques may be completely passive, the techniques described in FIGS. 15-18 require some energy input to switch the heat flow and cycle the temperature which will decrease the net conversion efficiency by some small amount.

Figure 19:
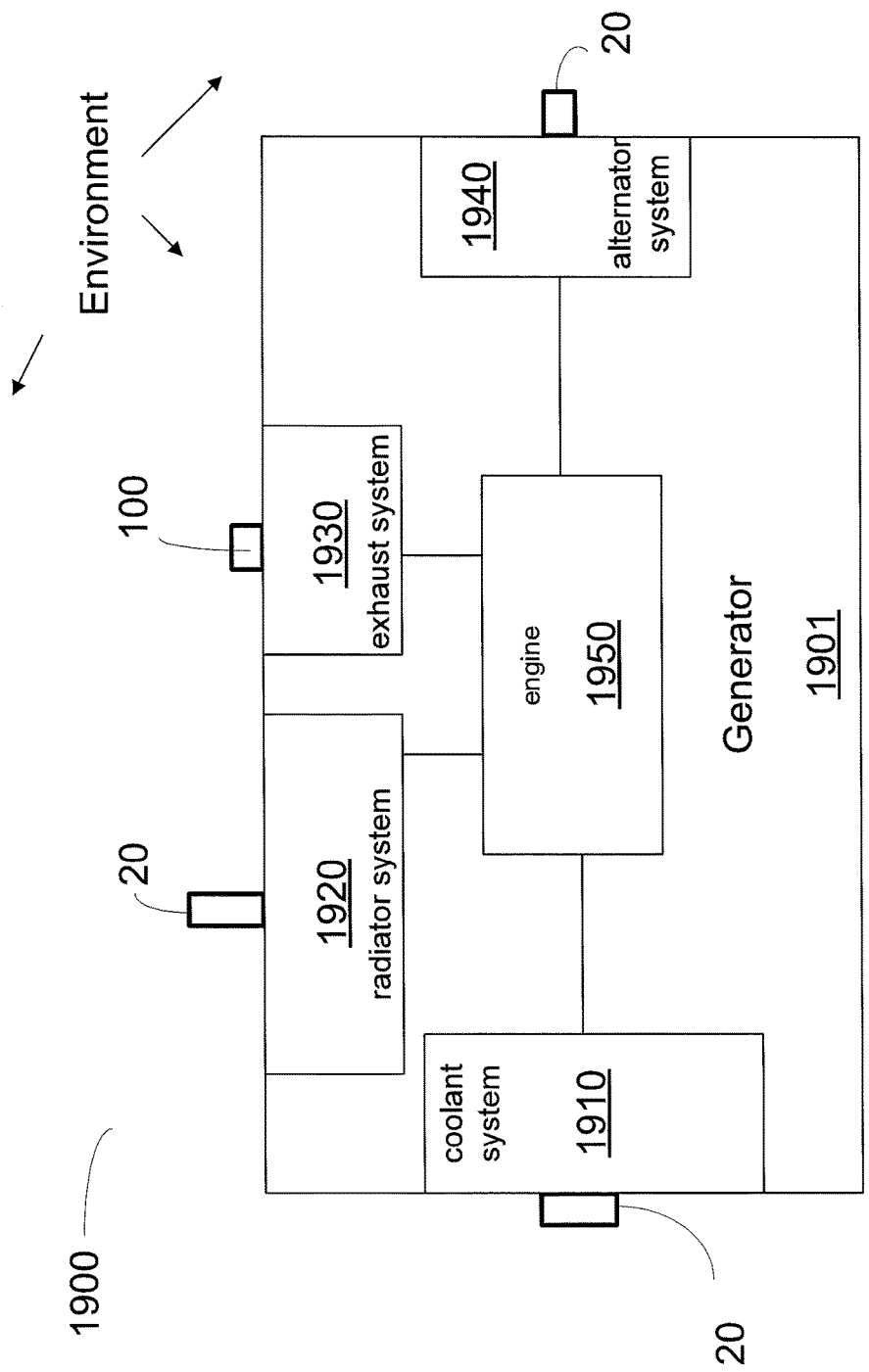
FIG. 19 illustrates a diesel genset including a PEC energy harvesting element, according to some embodiments.

FIG. 19 illustrates a diesel genset 1900 including PEC energy harvesting elements 20, according to some embodiments. The typical diesel generator 1901 operates with a fuel efficiency of approximately 36% (approximately 36% of the fuel energy is converted to electrical power by the genset). The next two largest energy losses are through the coolant system 1910 (25%) and the exhaust gases (30%) in the exhaust system 1930. Also, genset 1900 may include a radiator system 1920, to release heat into the environment, and an alternator system 1940 to convert work from engine 1950 into electrical power. Engine 1950 may be an internal combustion engine. In some embodiments, engine 1950 may be a solar cell system, a wind turbine, a bio-convertor, or any other form of engine that performs work through a thermodynamic cycle between a hot source and a cold sink.

The coolant fluid coming from the internal combustion engine and to the radiator system 1920 is approximately 80° C. Replacing the radiator system 1920 with a PEC energy harvester 20 with properties as described (80% efficiency relative to the Carnot efficiency) would yield a thermal efficiency of 14%. Since 25% of the thermal energy is dissipated through the radiator, the increase in fuel efficiency of the genset by harvesting this waste heat would be approximately 3.5%.

The exhaust gas temperature in exhaust system 1930 is approximately 525° C. The pyroelectric SBN compositions previously described have a maximum Curie temperature of approximately 200° C. Therefore the exhaust gas would need to pass through a heat spreader so that the maximum temperature would be near 200° C. From this heat spreader the cascaded SBN PEC harvester 100 could convert the waste heat with a thermal efficiency of 26% yielding an increase in genset fuel efficiency of about 7.8%. The combined waste heat recovery (coolant and exhaust gas heat recovery) would increase the efficiency of the genset by as much as approximately 11.3% (increasing from 36% to 47%) reducing fuel consumption by 32% to obtain the same energy output. Capturing the waste heat from the coolant system and the exhaust gas stream could be accomplished with after market add-ons that require no changes to the genset design. In addition, the PEC add-ons could be made modular so that scaling to a higher power genset would not require redesign.

Embodiments as illustrated in FIG. 19 may include a genset having an internal combustion engine for producing electrical energy, a coolant system 1910, an exhaust system 1930, an alternator system 1940, and an energy harvester, the energy harvester including: a material having a Curie temperature, the material subjected to an electric field; a hot source at a first temperature; a cold sink at a second temperature; the material is configured to be thermally coupled to the hot source while the cold sink is thermally insulated from the material. In some embodiments, the material is also configured to be thermally coupled to the cold sink while the hot source is thermally insulated from the material. According to some embodiments, the first temperature is higher than the Curie temperature, and the second temperature is lower than the Curie temperature.

In some embodiments, a genset may be configured so that the hot source in the energy harvester is in thermal contact with a hot portion of the coolant system, and the cold sink of the energy harvester is in thermal contact with the air surrounding the genset. In some embodiments, a genset may be configured so that the hot source in the energy harvester is in thermal contact with a hot portion in the exhaust element, and the cold sink of the energy harvester is in thermal contact with the air surrounding the genset. Further according to some embodiments, a genset may be configured such that the hot source in the energy harvester is in thermal contact with a hot portion in the alternator, and the cold sink of the energy harvester is in thermal contact with the air surrounding the genset.

It should also be noted that while SBN shows the potential to be an excellent PEC material, there are other pyroelectric materials that may also be candidates for efficient PEC energy harvesting. Particularly interesting for increasing the efficiency of a diesel genset is the Na doped SBN crystals (SBNN) which have Curie temperatures that could reach 550° C. One could conceive of converting waste heat from the exhaust stream without the heat spreader. This would then allow for a higher Carnot efficiency of 64%. If these crystals have spontaneous polarization and permittivity behavior similar to SBN61. Approximately 80% relative efficiency would then yield a thermal conversion efficiency of 51% which is much higher than the efficiency of the diesel genset itself. As a result an all solid state thermal to electrical generator could be constructed in which the diesel is burned to directly heat the PEC energy harvester with nearly double the efficiency of an internal combustion engine genset. This solid state generator would have the advantage of silent operation and no moving parts (reducing maintenance and increasing lifetime). Of particular relevance for expeditionary deployment, the PEC generator could use any local fuel as a heat source (unrefined crude oil, coal, natural gas, wood etc.) alleviating many of the logistical and cost burdens of operating far from refined fuel sources.

In addition, any heat source can be used to power the PEC generator including zero green-house emission sources such as solar, geo-thermal, and simple nuclear decay (non chain reaction). PEC can convert the low grade thermal energy of these sources to usable electrical power, according to some embodiments. In some embodiments a PEC element may also act as its own backup generator when these non traditional sources are insufficient to generate the require electricity. For example, if the solar irradiance were insufficient to supply the heat required to meet the power demands of a given installation (cloudy days), traditional fuels could be burned to add additional heating capacity to the same PEC energy harvester thus increasing output to meet demand.

Figure 20:
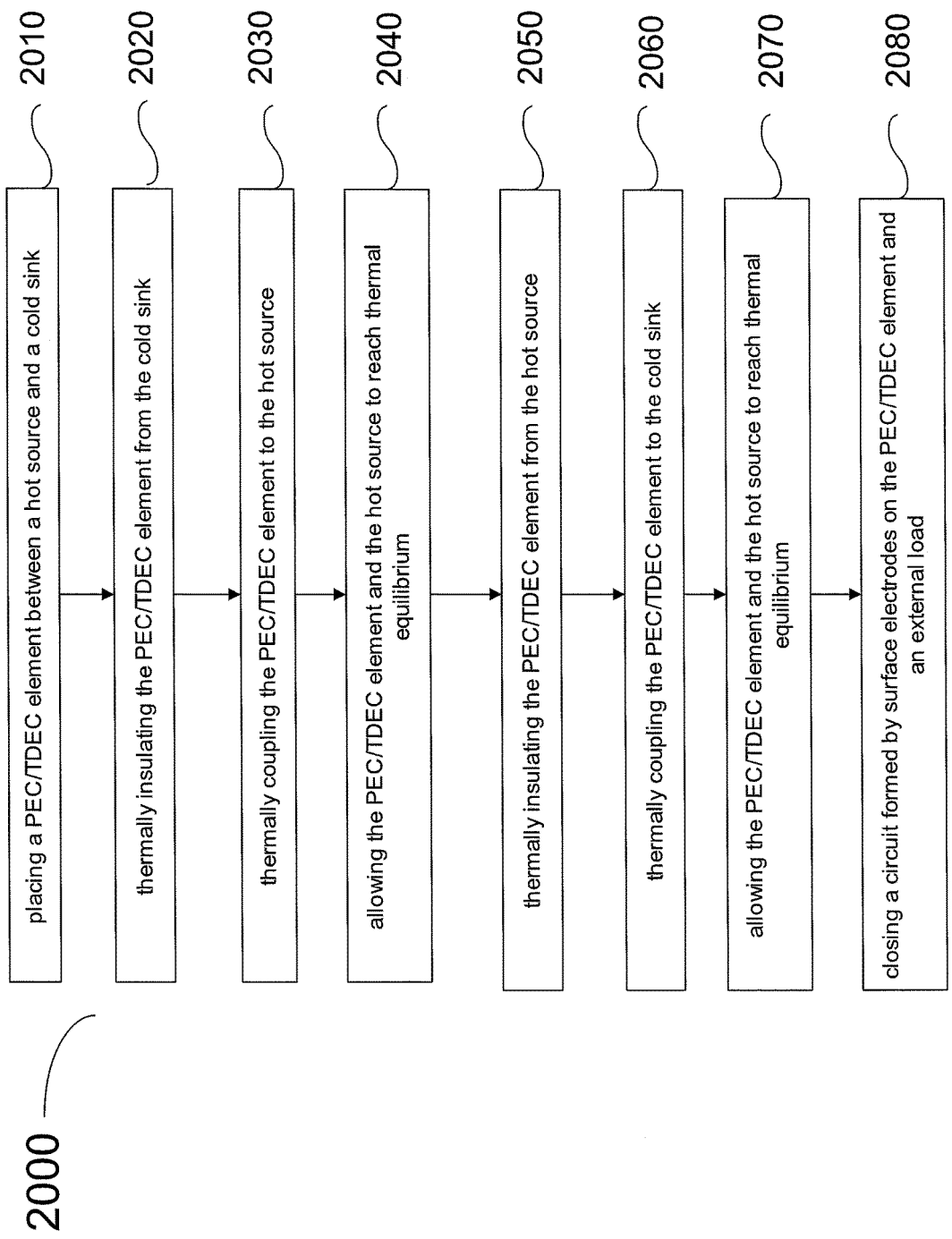
FIG. 20 illustrates a flow chart of a method for harvesting energy using a pyroelectric energy production cycle according to some embodiments.

FIG. 20 illustrates a flow chart of a method 2000 for harvesting energy using a pyroelectric energy production cycle according to some embodiments. Step 2010 includes placing a material between a hot source and a cold sink. In some embodiments the material has a Curie temperature lower than the first temperature and higher than the second equilibrium temperature. Step 2020 includes thermally insulating the material from the cold sink. Step 2030 includes thermally coupling the material to the hot source. Step 2040 includes allowing the material and the hot source to reach equilibrium at a first temperature. Step 2050 includes thermally insulating the material from the hot source. Step 2060 includes thermally coupling the material to the cold sink. Step 2070 includes allowing the material and the cold sink to reach equilibrium at a second temperature. Step 2080 may include closing a circuit formed by a first surface electrode on a first side of the material, a second surface electrode on a second side of the material, and an external load.

In some embodiments, the material used in method 2000 described above may be a pyroelectric material, a thermodielectric material, and a ferroelectric material, as described in detail in the present disclosure.

Embodiments provided in this disclosure are exemplary only and are not intended to be limiting. One skilled in the art will recognize variations, each of which should be considered to be within the scope of this disclosure. As such, the application is limited only by the claims.

We claim:

1. An energy generator, comprising:
a material having a Curie temperature, the material being chosen from the set consisting of Strontium Barium Niobate ($Sr_xBa_{1-x}Nb_2O_6$), a mixed solid solution of Lithium Niobate and Lithium Tantalate ($LiNb_{1-x}Ta_xO_3$), and Strontium Barium Sodium Niobate ($[Sr_xBa_{1-x}]_2NaNb_5O_{15}$) where the Curie temperature varies with x, where x is a value between 0 and 1 that is associated with the Curie temperature;
a hot source at a first temperature;
a cold sink at a second temperature;
a hot thermal coupler that selectively couples the hot source to the material while thermally insulating the cold sink from the material; and
a cold thermal coupler that selectively couples the cold sink to the material while thermally insulating the hot source from the material, wherein:
the first temperature is higher than the Curie temperature, and the second temperature is lower than the Curie temperature.

2. The energy generator of claim 1 wherein an electric field is applied to the material from an external source.

3. The energy generator of claim 1 wherein the material is a pyroelectric material.

4. The energy generator of claim 1 wherein the material is a ferroelectric material.

5. The energy generator of claim 1 wherein the material is a single crystal.

6. The energy generator of claim 1 further comprising surface electrodes on opposite sides of the material and a plurality of electrical switches in contact with the surface electrodes.

7. The energy generator of claim 6 further comprising an electrical storage device coupled to the electrical switches to store charge produced on the surface electrodes.

8. The energy generator of claim 1 wherein the hot thermal coupler moves the material into contact with the hot source.

9. The energy generator of claim 1 wherein the hot thermal coupler is a gap thermal conductor placed between the hot source and the material.

10. The energy generator of claim 1 wherein the the hot thermal coupler is a variable reflectivity element.

11. The energy generator of claim 1 wherein the the hot thermal coupler comprises a fluid in contact with the hot source and the material and a piston to move the fluid.

12. An energy generator, comprising:
a hot source at a first temperature;
a cold sink at a second temperature;
a plurality of elements placed between the hot source and the cold sink, each element comprising:
a material having a Curie temperature, the material being chosen from the set consisting of Strontium Barium Niobate ($Sr_xBa_{1-x}Nb_2O_6$), a mixed solid solution of Lithium Niobate and Lithium Tantalate ($LiNb_{1-x}Ta_xO_3$), and Strontium Barium Sodium Niobate ($[Sr_xBa_{1-x}]_2NaNb_5O_{15}$) where the Curie temperature varies with x, where x is a value between 0 and 1 that is associated with the Curie temperature;
a hot thermal coupler that selectively couples the hot source to a first element in the plurality of elements;
a cold thermal coupler that selectively couples the cold sink to a second element in the plurality of elements; and
element thermal couplers that couple each pair of adjacent elements positioned between the first element and the second element while insulating the adjacent elements from the hot source, the cold sink, and the other elements in the plurality of elements, wherein:
the elements are cascaded between the first element at the hot source and the second element at the cold sink in decreasing order of the Curie temperature of the material in each element; and
the first temperature is higher than the Curie temperatures of the materials included in the elements, and the second temperature is lower than the Curie temperatures of the materials included in the elements.

13. The energy generator of claim 12 wherein each of the elements in the plurality of elements further includes surface electrodes on opposite sides of the material; and
an electrical switch coupling the surface electrodes to an external load or electrical storage device.

14. A genset comprising an internal combustion engine for producing electrical energy, a coolant system, an exhaust element, an alternator, and an energy harvester, the energy harvester comprising:
a material having a Curie temperature, the material being chosen from the set consisting of Strontium Barium Niobate ($Sr_xBa_{1-x}Nb_2O_6$), a mixed solid solution of Lithium Niobate and Lithium Tantalate ($LiNb_{1-x}Ta_xO_3$), and Strontium Barium Sodium Niobate ($[Sr_xBa_{1-x}]_2NaNb_5O_{15}$) where the Curie temperature varies with x, where x is a value between 0 and 1 that is associated with the Curie temperature, wherein the material is subjected to an electric field;
a hot source at a first temperature;
a cold sink at a second temperature;
a hot thermal coupler that selectively couples the hot source to the material while thermally insulating the cold sink from the material;
a cold thermal coupler that selectively couples the cold sink to the material while thermally insulating the hot source from the material, wherein:
the first temperature is higher than the Curie temperature; and the second temperature is lower than the Curie temperature.

15. The genset of claim 14 wherein the hot source in the energy harvester is in thermal contact with a hot portion of the coolant system, and the cold sink of the energy harvester is in thermal contact with the air surrounding the genset.

16. The genset of claim 14 wherein the hot source in the energy harvester is in thermal contact with a hot portion in the exhaust element, and the cold sink of the energy harvester is in thermal contact with the air surrounding the genset.

17. The genset of claim 14 wherein the hot source in the energy harvester is in thermal contact with a hot portion in the alternator, and the cold sink of the energy harvester is in thermal contact with the air surrounding the genset.

18. An energy generator, comprising:
a hot source having a first temperature;
a cold sink having a second temperature; and
a material configured to be thermally coupled to at least one of the hot source and the cold sink, the material being subjected to an electric field and having a Curie temperature that is less than the first temperature and higher than the second temperature, wherein the material is chosen from the set consisting of Strontium Barium Niobate ($Sr_xBa_{1-x}Nb_2O_6$), a mixed solid solution of Lithium Niobate and Lithium Tantalate ($LiNb_{1-x}Ta_xO_3$), and Strontium Barium Sodium Niobate ($[Sr_xBa_{1-x}]_2NaNb_5O_{15}$) where the Curie temperature varies with x, where x is a value between 0 and 1 that is associated with the Curie temperature;
and the material is further configured to:
transfer thermal energy from the hot source when the material is thermally coupled to the hot source and thermally insulated from the cold sink; and
transfer thermal energy to the cold sink when the material is thermally coupled to the cold sink and thermally insulated from the hot source.

19. The energy generator of claim 18, wherein the material is thermally coupled to the hot source by moving the material into contact with the hot source.

20. The energy generator of claim 18, wherein material is thermally coupled to the hot source by a gap thermal conductor placed between the hot source and the material.

21. The energy generator of claim 18, wherein the material is thermally coupled to the hot source by a variable reflectivity element.

22. The energy generator of claim 18, wherein the material is thermally coupled to the hot source by a fluid in contact with the hot source and the material, the fluid being moved across the hot source and the material by a piston.

23. A method for harvesting energy using a pyroelectric energy production cycle, the method comprising:
placing a material with a Curie Temperature between a hot source and a cold sink, the material being chosen from the set consisting of Strontium Barium Niobate ($Sr_xBa_{1-x}Nb_2O_6$), a mixed solid solution of Lithium Niobate and Lithium Tantalate ($LiNb_{1-x}Ta_xO_3$), and Strontium Barium Sodium Niobate ($[Sr_xBa_{1-x}]_2NaNb_5O_{15}$) where the Curie temperature varies with x, where x is a value between 0 and 1 that is associated with the Curie temperature, the Curie temperature being between a first temperature of the hot source and a second temperature of the cold sink;
thermally insulating the material from the cold sink;
thermally coupling the material to the hot source;
allowing the material and the hot source to reach equilibrium at the first temperature;
thermally insulating the material from the hot source;
thermally coupling the material to the cold sink;
allowing the material and the cold sink to reach equilibrium at the second temperature; and closing a circuit formed by a first surface electrode on a first side of the material, a second surface electrode on a second side of the material, and an external load.

\* \* \* \* \*